(12) United States Patent
Lal

(10) Patent No.: US 11,892,344 B2
(45) Date of Patent: *Feb. 6, 2024

(54) ULTRASONIC FOURIER TRANSFORM ANALOG COMPUTING APPARATUS, METHOD, AND APPLICATIONS

(71) Applicant: Cornell University, Ithaca, NY (US)

(72) Inventor: Amit Lal, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/721,882

(22) Filed: Apr. 15, 2022

(65) Prior Publication Data

US 2022/0326071 A1    Oct. 13, 2022

Related U.S. Application Data

(63) Continuation of application No. 17/057,868, filed as application No. PCT/US2019/033721 on May 23, 2019, now Pat. No. 11,333,548.

(60) Provisional application No. 62/675,415, filed on May 23, 2018.

(51) Int. Cl.
| | | |
|---|---|---|
| *G01N 29/46* | (2006.01) | |
| *G01H 11/08* | (2006.01) | |
| *G06F 17/14* | (2006.01) | |
| *H10N 30/50* | (2023.01) | |
| *H10N 30/85* | (2023.01) | |
| *H04B 11/00* | (2006.01) | |

(52) U.S. Cl.
CPC .............. *G01H 11/08* (2013.01); *G01N 29/46* (2013.01); *G06F 17/142* (2013.01); *H10N 30/50* (2023.02); *H10N 30/85* (2023.02); *G01N 2291/0426* (2013.01); *H04B 11/00* (2013.01)

(58) Field of Classification Search
CPC .......... G01N 29/46; G01N 2291/0426; G01H 11/08; H01L 41/083; H01L 41/18; G06F 17/142; H04B 11/00
See application file for complete search history.

(56) References Cited

U.S. PATENT DOCUMENTS

| | | | | |
|---|---|---|---|---|
| 4,591,241 A | * | 5/1986 | Huignard ............... | G01R 23/17 359/305 |
| 4,692,722 A | * | 9/1987 | Reichel .................. | G10K 11/26 333/144 |
| 4,852,575 A | * | 8/1989 | Nikoonahad ............ | A61B 8/06 73/861.27 |
| 2012/0147698 A1 | * | 6/2012 | Wong ....................... | B06B 1/02 367/87 |

* cited by examiner

*Primary Examiner* — Suman K Nath
(74) *Attorney, Agent, or Firm* — Barnes & Thornburg LLP

(57) ABSTRACT

A device configured for low-energy ultrasonic 2D Fourier transform analysis, comprising: (i) a first layer comprising an array of piezoelectric pixels; (ii) a second layer comprising an array of piezoelectric pixels; (iii) a third layer, positioned between the first and second layers, comprising a bulk ultrasonic transmission medium; wherein the second layer of array of piezoelectric pixels is in the Fourier plane of an input signal of the first layer array of piezoelectric pixels.

20 Claims, 25 Drawing Sheets

(a)

(b)

ULTRASONIC FOURIER TRANSFORM ANALOG COMPUTING APPARATUS, METHOD, AND APPLICATIONS

CROSS-REFERENCE TO RELATED APPLICATIONS

This application is a continuation of U.S. patent application Ser. No. 17/057,868, submitted on Nov. 23, 2020, which was a U.S. National Phase filing of International Application No. PCT/US19/33724 filed May 23, 2019, which claimed priority to U.S. Provisional Patent Application Ser. No. 62/675,415 filed on May 23, 2018, and entitled"Ultrasonic Fourier Transform Analog Computing Apparatus, Method, and Applications," the entirety of each of which are incorporated herein by reference.

STATEMENT REGARDING FEDERALLY SPONSORED RESEARCH OR DEVELOPMENT

This invention was made with government support under Grant No.: N66001-12-C-2009 awarded by the Intelligence Advanced Research Projects Activity. The government has certain rights in the invention.

FIELD OF THE INVENTION

The present disclosure is directed generally to structures and methods for ultrasonic Fourier transform.

BACKGROUND

There is a continued need for ultrafast devices methods for computation to solve multi-dimensional nonlinear differential equations describing, for example, charge evolution in high density plasmas. For example, there are a vast variety of computational plasma problems concerning high energy fusion, such as predicting the instabilities in the Z-pinch, the plasma confinement system using an electrical current in the plasma to generate a magnetic field that compresses it. Indeed, controlling instabilities in nonlinear high-density plasmas is critical to understanding the limits of potential fusion energy-enabling phenomenon such as the Z-pinch, among other aspects. Since Z-pinch experiments are expensive and time-consuming, there is a continued need for rapid, such as ultrasonic, processing for 2-D fast Fourier transform (2DFFT).

SUMMARY OF THE INVENTION

The embodiments described herein are directed to a computing architecture and method that can compute a 2D Fourier Transform at a very fast rate, must faster e.g., 100-1000 times) than possible by traditional von Neumann architectures, and using much lower energy required by current electronic FFT (Fast Fourier Transform) computational devices or methods. The architecture includes arrays of piezoelectric pixels sandwiching a bulk ultrasonic transmission medium (e.g., silicon, sapphire, silicon-carbide) to generate ultrasonic waves that, when adding at a distance, provide an approximation to the 2DFFT of the input pattern. The embodiments described herein are also directed to the method of performing the ultrasonic 2DFFT utilizing the computing apparatus. Applications of the apparatus and method include but are not limited to solving multidimensional nonlinear differential equations such as the Vaslov equation, image processing for computer vision, medical imaging, image recognition, general signal processing, and more.

According to an embodiment is provided a device configured for low-energy ultrasonic 2D Fourier transform analysis. The device includes: (i) a first layer comprising an array of piezoelectric pixels; (ii) a second layer comprising an array of piezoelectric pixels; (iii) a third layer, positioned between the first and second layers, comprising a bulk ultrasonic transmission medium; wherein the second layer of array of piezoelectric pixels is in the Fourier plane of an input signal of the first layer array of piezoelectric pixels.

According to an embodiment, the first layer array of piezoelectric pixels is a top layer, and wherein the second layer array of piezoelectric pixels is a bottom layer.

According to an embodiment, the bulk ultrasonic transmission medium comprises silicon, sapphire, silicon-carbide, and/or combinations thereof.

According to an embodiment, the array of piezoelectric pixels of the first and/or second layer comprises PZT, aluminum nitride, zinc oxide, and/or combinations thereof.

According to an embodiment, the array of piezoelectric pixels of the first or second layer is configured to generate an ultrasonic wave for an approximation to the 2D Fourier transform of the input signal.

According to an embodiment, the array of piezoelectric pixels of the first and/or second layer comprises GHz transducers. According to an embodiment, the GHz transducers are approximately 0.5 to 5 GHz.

According to an embodiment, the device further includes one or more signal interconnects located externally to the first, second, and third layers.

According to an embodiment, the device further includes a complementary metal-oxide-semiconductor (CMOS) stack positioned between a top surface of the third layer and a bottom surface of the first layer.

According to an embodiment, the device further includes one or more signal interconnects and/or optical interconnects integrated by the CMOS stack.

According to an embodiment, at least one of the first and second arrays of piezoelectric pixels is configured to emit one or more waves into the third layer to produce a Fourier transform of the input signal phase and magnitude of voltages.

According to an embodiment, the device further includes a Fresnel lens configured to focus the input signal onto the array of piezoelectric pixels of the second layer.

According to an embodiment, at least one of the first and second arrays of piezoelectric pixels is configured to emit one or more waves into the third layer to produce a Fourier transform of the input signal phase and magnitude of voltages.

According to an embodiment, the device further includes a Fresnel lens configured to focus the input signal onto the array of piezoelectric pixels of the second layer.

According to an embodiment, the first or second array of piezoelectric pixels is configured to generate an ultrasonic wave and is divided into a plurality of concentric rings.

According to an embodiment, the first or second array of piezoelectric pixels is configured to generate an ultrasonic wave and is divided into a plurality of binary weighted slices.

According to an embodiment, the piezoelectric pixels in the first or second array of piezoelectric pixels can vary in width. According to an embodiment, the piezoelectric pixels in the first or second array of piezoelectric pixels vary in width from 1 wavelength to 10 wavelengths.

According to an embodiment, at least some of the piezoelectric pixels in the first and/or second array are spaced in height relative to other piezoelectric pixels in the array by a fraction of a wavelength.

According to an embodiment is a method for low-energy ultrasonic 2D Fourier transform analysis using a device comprising: (i) a first layer comprising an array of piezoelectric pixels; (ii) a second layer comprising an array of piezoelectric pixels; (iii) a third layer, positioned between the first and second layers, comprising a bulk ultrasonic transmission medium, wherein the second layer of array of piezoelectric pixels is in the Fourier plane of an input signal of the first layer array of piezoelectric pixels, the method comprising the steps: emitting, by the array of piezoelectric pixels of the first layer, one or more acoustic waves through the third layer; receiving, by the array of piezoelectric pixels of the second layer, the emitted one or more acoustic waves; and determining, from the received one or more acoustic waves, a Fourier transform of the one or more acoustic waves.

According to an embodiment, a far-field pattern of the array of piezoelectric pixels of the first layer is the Fourier transform of the input signal of the first layer.

According to an embodiment, the device further includes a complementary metal-oxide-semiconductor (CMOS) stack positioned between a top surface of the third layer and a bottom surface of the first layer.

These and other aspects of the invention will be apparent from reference to the embodiment(s) described hereinafter.

BRIEF DESCRIPTION OF THE DRAWINGS

In the drawings, like reference characters refer to the same parts throughout the different views, and the drawings are not necessarily to scale.

DETAILED DESCRIPTION OF EMBODIMENTS

Figure 1:
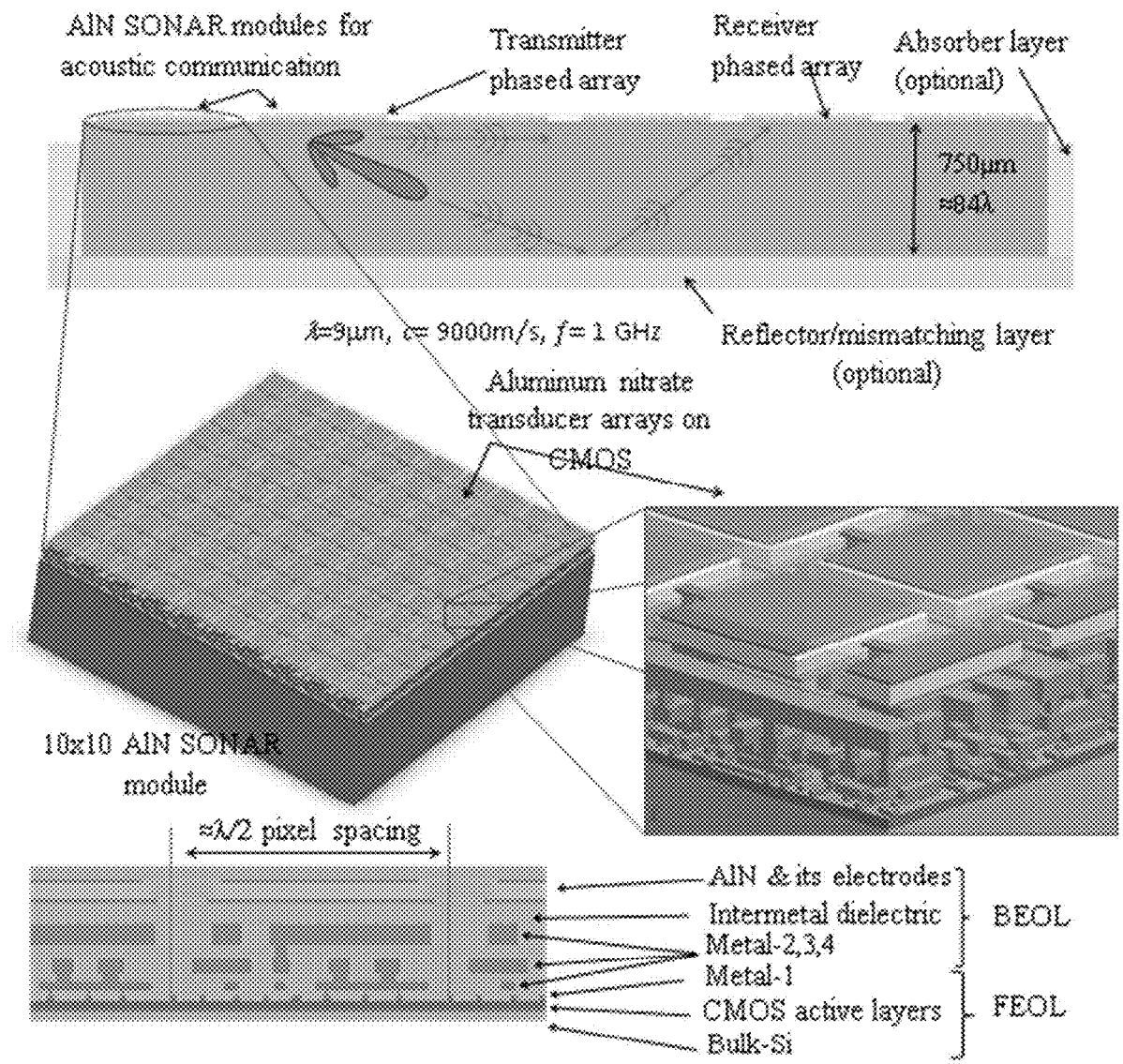
FIG. 1 is a schematic representation of a method and device comprising an ultrasonic Fourier transform computing apparatus, in accordance with an embodiment.

The present disclosure describes a computing architecture and method configured to compute 2D Fourier transform at an ultrasonic rate with low energy requirements. The architecture includes arrays of piezoelectric pixels sandwiching a bulk ultrasonic transmission medium (e.g., silicon, sapphire, silicon-carbide) to generate ultrasonic waves that provide an approximation to the 2DFFT of the input pattern. An aspect of the invention is an ultrasonic Fourier transform computing apparatus ("SFT computer" or "SFTC"). An embodiment of the SFTC includes a bulk ultrasonic wave transmission medium (e.g., silicon, sapphire, and/or others) having a top surface and a bottom surface, an array of piezoelectric (e.g. PZT, aluminum nitride, zinc oxide, etc.) GHz (0.5 to 5 GHz) transducers disposed on the top surface of the bulk ultrasonic wave transmission medium, and an array of piezoelectric GHz (0.5 to 5 GHz) transducers disposed on the bottom surface of the bulk ultrasonic wave transmission medium, wherein the bottom surface-located piezoelectric array is in the Fourier plane of the input signal top surface-located piezoelectric array. In one embodiment, control and processing electronics and signal interconnects are located external to the SFTC, although other designs are possible.

An embodiment of the SFTC includes a bulk ultrasonic wave transmission medium, a complementary metal-oxide-semiconductor (CMOS) stack disposed on the top surface of the ultrasonic wave transmission medium, an array of piezoelectric GHz (0.5 to 5 GHz) transducers disposed on top surface of the CMOS stack, and an array of piezoelectric GHz (0.5 to 5 GHz) transducers disposed on the bottom surface of the bulk ultrasonic wave transmission medium, wherein the bottom surface-located piezoelectric array is in the Fourier plane of the input signal top surface-located piezoelectric array. In this embodiment, control and processing electronics and signal interconnects are provided internally (integrated) by the CMOS stack and the optical interconnect(s).

An embodiment of the SFTC includes a bulk ultrasonic wave transmission medium (as above), a CMOS stack disposed on the top surface of the ultrasonic wave transmission medium, an optical interconnect disposed on top of the CMOS stack, an array of piezoelectric GHz (0.5 to 5 GHz) transducers disposed on top of the optical interconnect, and an array of piezoelectric GHz (0.5 to 5 GHz) transducers disposed on the bottom surface of the bulk ultrasonic wave transmission medium, wherein the bottom surface-located piezoelectric transducer array is in the Fourier plane of the input signal top surface-located piezoelectric transducer array. In this embodiment, control and processing electronics and signal interconnects are provided internally (integrated) by the CMOS stack and the optical interconnect(s).

A single processor 2D FFT requires roughly $0(5N^2 \log N)$ steps. Here the factor of 5 originates from local data loading and transferring. In addition to this time, there is a set of $N^2$ reads and writes for the initial state and final answer. The time for reading and writing from memory can be accelerated using optical data loading using on-chip optical data lines to 100-500 Gbits/second, Newly developed very fast memories can achieve Tbits/s data rate. Data in bulk can be loaded in bulk using a deep pipelining stages. This corresponds to a $t_{RW}$, of 16-40 ps per 16 bit data. For a 1024×1024 FFT, the time to load and unload can be ~30-70 μs. For the calculation time, $t_{calc}$ is the clock period, without pipelining. For a 3 GHz clock computer, one can estimate the calculation time to be 17.5 ms. One can parallelize FFT among M cores, but the speedup is not great as the data transfer across limits the computation speed.

To maximize the speed of calculation, it is best to make the computation time comparable to data loading and reading time. The calculation time of SFFT is dictated by the travel time of the 2D sonic energy across the silicon to form the FFT. The travel time is $t_{transit}=c_{sound}/L$, where $c_{sound}$ is the speed of sound, and L is the travel length. L is estimated to be on the order of 1-cm, and since speed of sound is 9000 m/s, the calculation time is estimated to be ~11.6 μs. This is comparable to the data input and output loading time. Following the acquisition of the analog data, this data will be converted to digital domain using ADC converters. The ADC conversion time can be in a flash converter with speeds exceeding 1 GSPS at 16 bits for a $t_{ADC}$=1 ns. Including N such ADC converters would lead to a time of ADC conversion to be $t_{ADC}=t_{ADCsingle}*N$. The number of ADCs can be decreased to save space and power and still be well ahead of traditional FFT calculation approach. For the nominal 1024 pixels this would translate to a time of ~1 μs.

Also described is an approach in which photodetectors receive light signals that are processed to control the amplitude and phase for the transmit plane. For the case of processing real time optical images, one can eliminate the need for data input and that portion of the time can be eliminated. If the optical microcantilevers are used to modulate light reflected in the receive plane, then the image is also not read so that part of the time is eliminated. For the case of pure optical in and optical out, one may see very high speedup gains limited only by the transit times of the ultrasonic wavefronts.

Referring to FIG. 1, in one embodiment, is schematic of a method and device comprising an ultrasonic Fourier transform computing apparatus (SFTC). The SFTC includes a bulk ultrasonic wave transmission medium (e.g., silicon, sapphire, and/or others) having a top surface and a bottom surface, an array of piezoelectric (e.g. PZT, aluminum nitride, zinc oxide, etc.) GHz (0.5 to 5 GHz) transducers disposed on the top surface of the bulk ultrasonic wave transmission medium, and an array of piezoelectric GHz (0.5 to 5 GHz) transducers disposed on the bottom surface of the bulk ultrasonic wave transmission medium, wherein the bottom surface-located piezoelectric array is in the Fourier plane of the input signal top surface-located piezoelectric array. In one embodiment, control and processing electronics and signal interconnects are located external to the SFCT, although other designs are possible.

Figure 2:
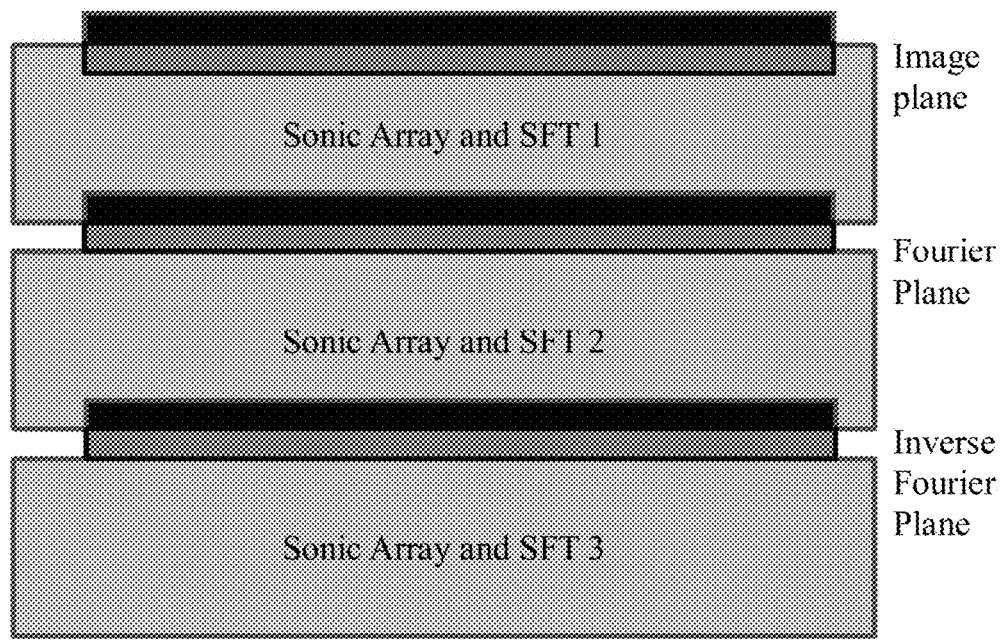
FIG. 2 is a schematic representation depicting different wafers stacked to achieve fast forward and inverse Fourier transform, in accordance with an embodiment.
Figure 3:
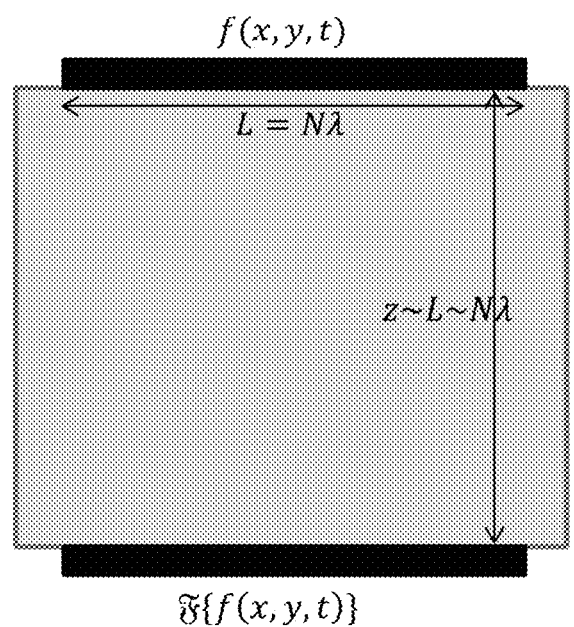
FIG. 3 is a schematic representation of an aluminum nitride (AlN) transducer array with CMOS substrate implementing SonicFFT, in accordance with an embodiment.

The array of 2D piezoelectric pixels can launch waves into the bulk silicon to produce a Fourier Transform of the input phase and magnitude of voltages applied at the input frame. CMOS integration allows very low energy and fast operation. Referring to FIG. 2, in one embodiment, is a schematic representation depicting different wafers stacked to achieve fast forward and inverse Fourier transform as described or otherwise envisioned herein. Referring to FIG. 3, in one embodiment, is an aluminum nitride (AlN) transducer array with CMOS substrate implementing the SFTC method (SonicFFT) as described or otherwise envisioned herein. Referring to FIG. 3, in one embodiment, is CMOS chips with AlN pixels (the flat panels on top) deposited on the CMOS chips at low temperatures.

According to an embodiment, the piezoelectric transducer array can control both the spatial amplitude and the phase of an ultrasonic wavefront propagating through a silicon substrate. At the focal plane of this wavefront, one can obtain the Fourier Transform of the input propagation of k-vectors adding up by laws of diffraction using receiving CMOS. The output ultrasonic pressure field is the Fourier transform of the of the input pressure field, using for example the following:

$$\left(p_0(x_0,y_0,z;\omega) \approx \frac{j\omega p_0 v_0}{2\pi R} e^{-jk\left[z+\frac{x_0^2+y_0^2}{2z}\right]} \mathcal{F}[p_i(x_1,y_1)]\right) \quad \text{(Eq. 1)}$$

Figure 4:
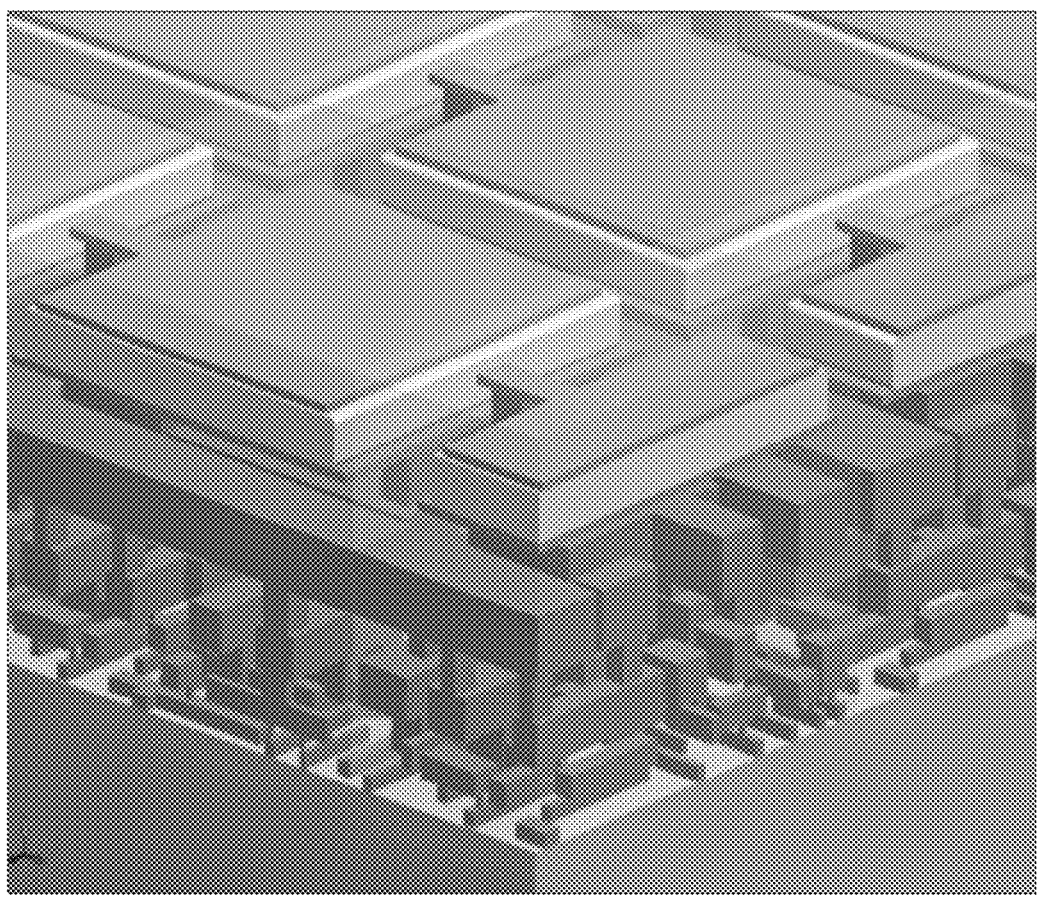
FIG. 4 is a schematic representation of CMOS chips with AlN pixels deposited on the CMOS chips at low temperatures, in accordance with an embodiment.

A thin film of aluminum nitride (AlN) transducer array integrated with CMOS substrate is used to implement the SonicFFT as shown in FIG. 4. Acoustic pulses are emitted from the transmitting transducer travel through a silicon wafer. The Fourier Transform of the acoustic pulse can be detected by the receiving transducer on the back side. The ultrasonic waves are launched to the piezoelectric transducer arrays on silicon from the top metal into the bulk. The ultralow dissipation of ultrasonic waves in silicon, coupled with a high coupling of the AlN piezoelectric thin films offers a very good technology platform for GHz ultrasonic wave propagation. The far-field pattern of an array of point emitters is the Fourier Transform of the original 2D input pulses.

The time of travel of the sonic pulses generated from the transducers to the Fourier plane is limited by the speed of sound. Each ultrasonic transducer width will be:

$$\delta x = \frac{c_{sound}}{2f} = \frac{\lambda}{2} \quad \text{(Eq. 2)}$$

Hence, the width of the transmitting aperture on the initial plane is $A=N\lambda$. The receiving aperture should be a distance A away to capture the wavefronts from all of the pixels, Therefore, the time of calculation is:

$$\Delta T = \frac{A}{c_{sound}} = \frac{N\lambda}{c_{sound}} = \frac{N}{f} \quad \text{(Eq. 3)}$$

If one envisions one clock cycle of the ultrasound to that of the clock on a microprocessor, one can state that a 2D FFT using the SonicFFT technique would be an O(N) computation complexity. The physical properties of wave propagation and additions perform the cross additions needed for a 2D FFT which in real time is implemented on a massively parallel processor with the complexity of $O(N^2 \log_2 N)$.

According to an embodiment, the SonicFFT uses the fact that an ultrasonic transducer pixel array can control both spatial amplitude and phase of an ultrasonic wavefront propagating through a silicon. At the focal plane of this wavefront, one can obtain the Fourier Transform of the initial wavefront due to propagation of k-vectors adding up by laws of diffraction. The lateral dimensions of the transmission array is $L=N\lambda$ where N is the number of pixels and $\lambda$ is the ultrasonic wavelength. This wavelength is 9 µm for a frequency of 1 GHz. Hence, a 1000×1000 array of pixels would occupy an area of 9×9 mm. The length over which the wavefront needs to traverse is approximately L wavelengths also for the k-vectors to add up without losing energy on the sides. Hence, the distance to be traversed is approximately $L=N\lambda$ also. The transit time or the calculation time:

$$t_{trransit} \text{ is } t_{transit} = \frac{L}{c} = \frac{N\lambda}{c} = \frac{N}{v} = T*N \quad \text{(Eq. 3)}$$

where c is the speed of sound (9000 m/s for silicon) and v is the frequency, and T is the period of the ultrasound. Hence, it is seen that at GHz frequencies, which are comparable to the clock frequencies of modern multi-core processors, the number of cycles consumed in the microprocessor can be compared to the transit time of the ultrasonic wavefront. The order of computation can be thought of as O(N) as it takes ~N cycles of the the GHz clock to get the computation done. This analog-domain FFT would occur in O[N], for a N×N 2D array of data, drastically faster than the $O[N^2 \text{Log}(N)]$ for a single micro controller.

Principle of SonicFFT

Figure 5:
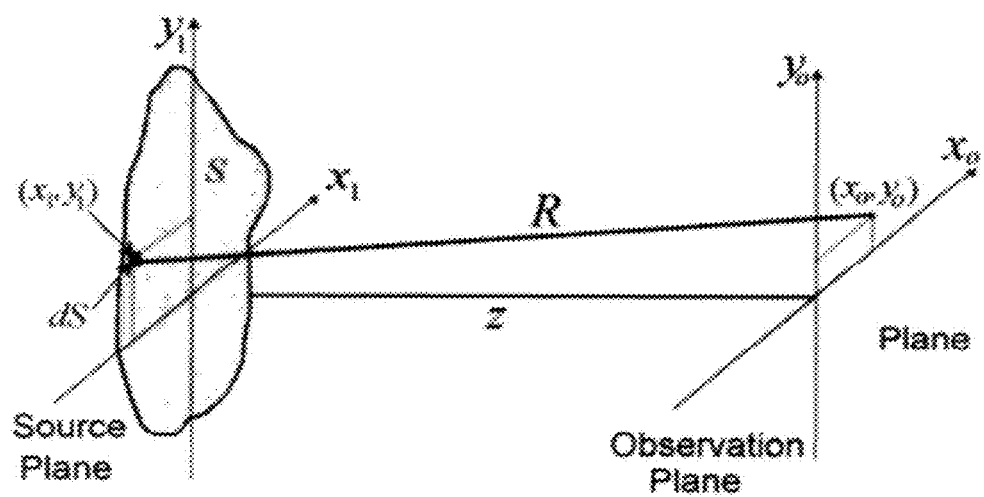
FIG. 5 is a schematic representation of a transducer of area S situated on a source plane, in accordance with an embodiment.

Referring to FIG. 5, according to an embodiment, is a schematic representation of a transducer of area S situated on a source plane $(x_1,y_1)$ and its radiation is observed on an observation plane $(x_0,y_0)$. There is an arbitrary plane radiating surface S, lying on the plane $(x_1, y_1, 0)$, an element of area dS $(x_1, y_1, 0)$, which is at a distance R from an observation point that lies on the plane $(x_0, y_0, z)$.

Assuming sinusoidal excitation, the normal component of the transducer velocity is $$v_{no}(t) = \xi_0(x_1, y_1) v_0 e^{j\omega t} \quad \text{(Eq. 4)}$$

where $\xi_0$ is the spatial variation (apodization function) across the transducer, $v_0$ is a constant velocity amplitude, and $\omega$ is the frequency at which the transducer is driven. As the wavefront has undergone Fraunhofer diffraction through the transducer, for a circular piston transducer of radius a and thickness $$z > \frac{2.3 a^2}{\lambda},$$

the Fraunhofer integral can be approximately modeled as a Rayleigh integral. The Fraunhofer approximation of R can be assumed to be constant during the integral. Using the Rayleigh integral equation, the velocity potential for a far field point on the observation plane is:

$$\phi_N(x_0, y_0, z; t) = \quad \text{(Eq. 5)}$$

$$\int\int_S \frac{\xi_0(x_1, y_1) v_0 e^{j\omega\left(t-\frac{R}{c_0}\right)}}{2\pi R} dS \approx \frac{v_0 e^{j\omega t}}{2\pi R} \int\int_S \xi_0(x_1, y_1) e^{-j\omega \frac{R}{c_0}} dS$$

Taking $k=\omega/c_0$, $dS=dx_1 dy_1$, and express the transducer by an aperture function $\Omega(x_1,y_1)$, where $\Omega(x_1,y_1)=1$ in S and 0 outside S, the Fraunhofer approximation for the velocity potential can now be written:

$$\phi_N(x_0, y_0, z; t) \approx \frac{v_0 e^{j\omega t}}{2\pi R} e^{-jk\left[z+\frac{x_0^2+y_0^2}{2z}\right]} \quad \text{(Eq. 6)}$$

$$\int_{-\infty}^{+\infty}\int_{-\infty}^{+\infty} \Omega(x_1, y_1) \xi_0(x_1, y_1) e^{\frac{jk}{z}(x_0 x_1 + y_0 y_1)} dx_1 dy_1$$

The spatial frequencies in the x and y directions are $$k_x = -\frac{kx_0}{z} \text{ and } k_y = -\frac{ky_0}{z}.$$

The pressure phasor is related to the velocity potential phase by $p = j\omega\rho_0\phi_N$. Therefore, the pressure at the observation point can be written as:

$$p(x_0, y_0, z; \omega) \approx \frac{j\omega\rho_0 v_0}{2\pi R} e^{-jk\left[z + \frac{x_0^2 + y_0^2}{2z}\right]} \quad \text{(Eq. 7)}$$

$$\int_{-\infty}^{+\infty}\int_{-\infty}^{+\infty} \Omega(x_1, y_1)\xi_0(x_1, y_1) e^{-j(k_x x_1 + k_y y_1)} dx_1 dy_1$$

The integral portion can be recognized to be a 2D Fourier Transform of the product of the aperture and apodization functions:

$$p(x_0, y_0, z; \omega) \approx \frac{j\omega\rho_0 v_0}{2\pi R} e^{-jk\left[z + \frac{x_0^2 + y_0^2}{2z}\right]} \mathcal{F}[\Omega(x_1, y_1)\xi_0(x_1, y_1)] \quad \text{(Eq. 8)}$$

From the above expression, it can be seen that Fourier transform is scaled by an amplitude term $$C = \frac{\omega\rho_0 v_0}{2\pi R}$$

and a phase term $$\Phi = je^{-jk\left[z + \frac{x_0^2 + y_0^2}{2z}\right]}.$$

As in Fraunhofer approximation, R is constant and $(x_1^2 + y_1^2)$ term can be neglected, the pressure wave on a receiving plane can be described as the product of a constant term, a phase term, and the Fourier transform of the apodization function times the apertures function. One can recover the Fourier Transform by dividing the pressure wave by a constant factor.

In order to calculate the effective scanning region for the SonicFFT, it is necessary to find the maximum span in frequency. The span in frequency space on the x and y axes should be $-B_x \leq f_x \leq B_x$ and $-B_y \leq f_y \leq B_y$, where $B_x$ and $B_y$ are the maximum bandwidths of interest.

One can relate $f_x$ and $f_y$ to $k_x$ and $k_y$ as follows:

$$2\pi f_x = k_x$$

$$2\pi f_y = k_y \quad \text{(Eq. 8)}$$

And one can relate $k_x$ and $k_y$ to the spatial coordinates $x_0$ and $y_0$ on the observation plane:

$$k_x = -\frac{kx_0}{z} \quad \text{(Eq. 9)}$$

$$k_y = -\frac{ky_0}{z}$$

where k is $2\pi/\lambda$ and z is the distance between the source and observation planes. Combining the above expressions, it is found that:

$$x_{0,max/min} = y_{0,max/min} = \pm\frac{zk_{x,max}}{k} = \pm z\lambda B_{x,y} \quad \text{(Eq. 10)}$$

assuming $B_x = B_y = B_{x,y}$.

To give a tighter bound to the dimensions of the receive array, one must take a closer look at which this bandwidth should be. While the bandwidth of interest depends on the problem to be solved, it is also restricted by the dimensions of the received array.

As the effective bandwidths of a circular aperture of radius a and a square aperture of width 2a are both 5/a. One can relate this to the maximum span in frequency space as follows:

$$f_{x,max} = f_{y,max} = \frac{5}{a} \quad \text{(Eq. 11)}$$

$$f_{x,min} = f_{y,min} = -\frac{5}{a}$$

Substituting into previous equations defining $k_x$ and $k_y$, the final equation is obtained.

Figure 6:
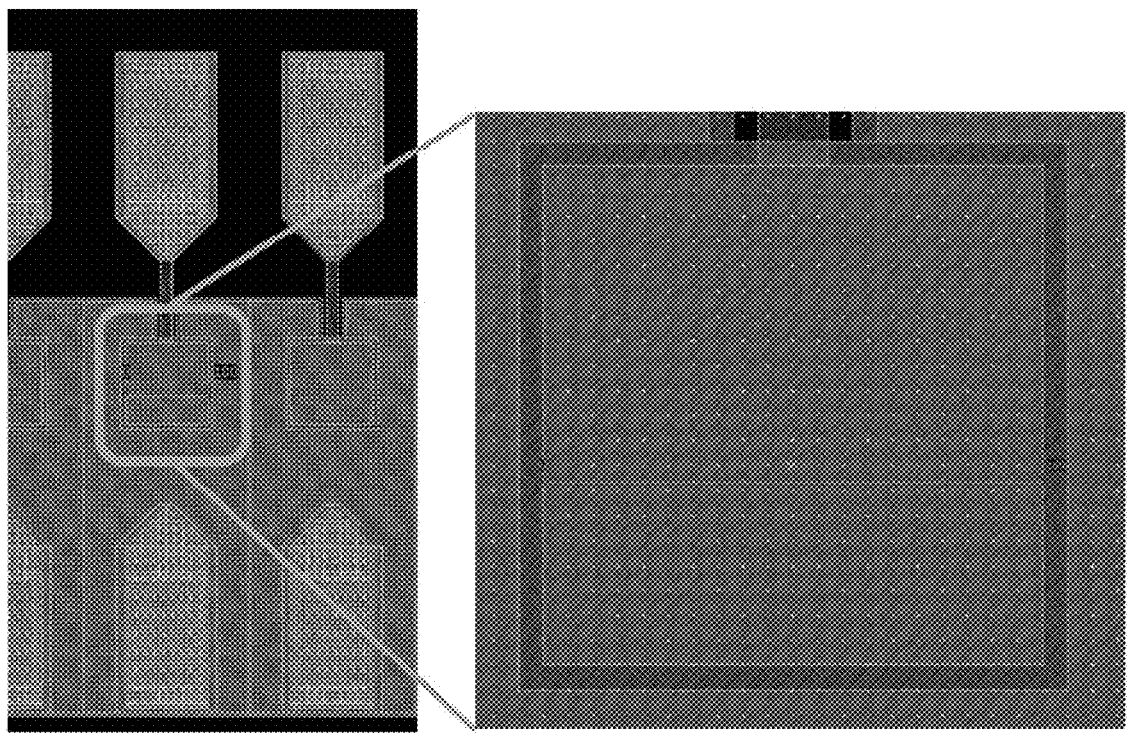
FIG. 6 is a schematic representation of a square transducer with width=100 μm for testing, in accordance with an embodiment.

As discussed in the derivation, to reach the final equation of the SonicFFT, one must assume that the $(x_1^2 + y_1^2)$ term and higher order terms in R can be neglected. That is, the transducer is operating in Fraunhofer zone. Therefore, the thickness of the transducer $$z > \frac{2.3a^2}{\lambda}$$

should be satisfied. The error between the Rayleigh integral and the Fraunhofer approximation is less than 5%. In this process, the silicon thickness z=725 μm. Therefore, the transducer width should be less than 103.12 μm. For the best impedance match, one choses a square transducer with width=10 μm for the testing. A possible layout is shown in FIG. 6.

With the tested transducer, width=100 μm (a=50 μm), thickness z=725 μm, speed of sound in silicon c=8433 m/s, resonant frequency f=1.2 GHz, one can calculate the maximum scanning span $x_{0,max/min} = y_{0,max/min} = \pm 611.4$ μm. As the affective bandwidth is $$\frac{5}{a},$$

the Nyquist sampling frequency is $$\frac{10}{a}.$$

Thus, ideally the received SonicFFT should be sampled at space interval $$\Delta x \leq \frac{a}{10} \text{ and } \Delta y \leq \frac{a}{10}$$

which is less than or equal to 5 μm. However, to expedite the simulation, a sample point was obtained every 11 μm and use Gaussian interpolation in Python to smooth out the result.

Figure 7:
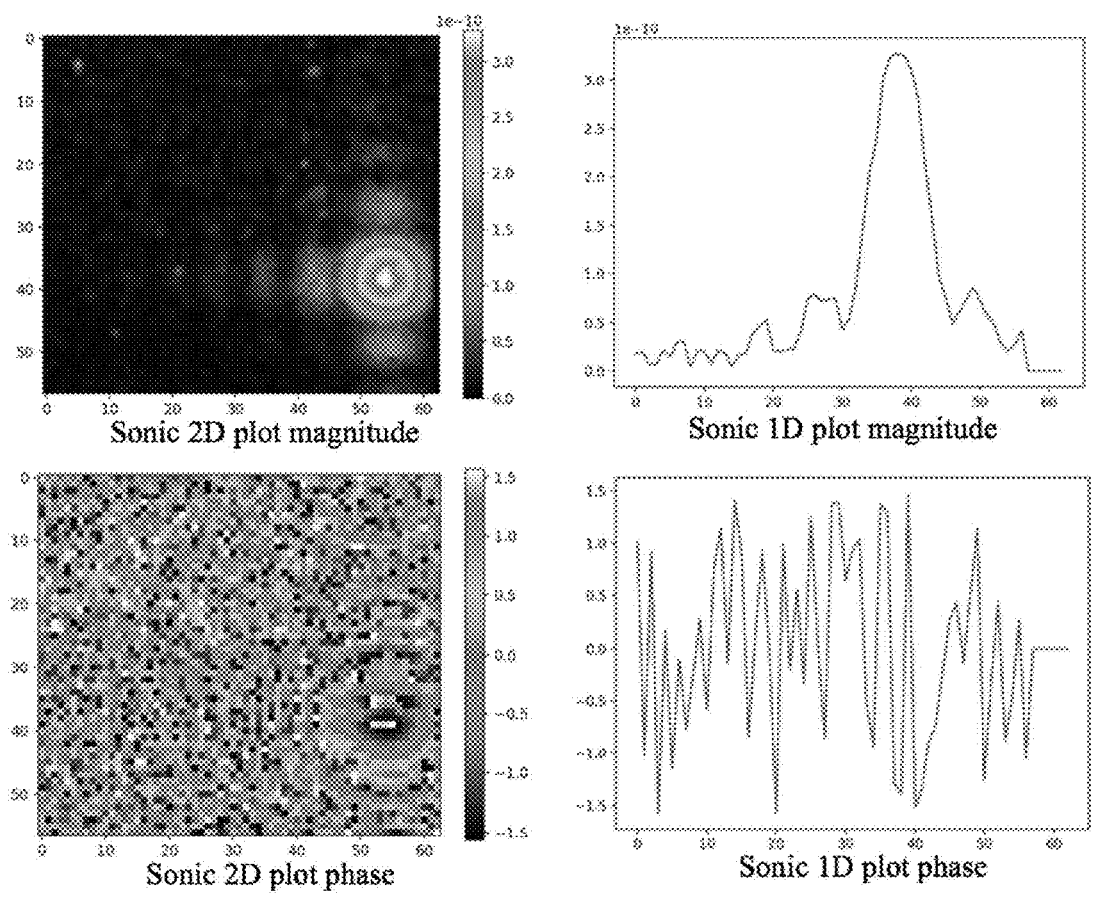
FIG. 7 depicts results of experiments using a 100 μm square transducer, in accordance with an embodiment.

Referring to FIG. 7, in one embodiment, are the results of these experiments.

The definition of the 2-D Fourier transform $F(k_x,k_y)$ of a function $f(x,y)$ is as follows:

$$F(k_x,k_y) = \mathcal{F}[f(x,y)] = \int_{-\infty}^{\infty}\int_{-\infty}^{\infty} f(x,y)e^{-j(k_x x+k_y y)}dxdy \quad \text{(Eq. 12)}$$

Field propagation physics can be used to obtain a Fourier transform in two ways—using a lens and without using a lens but applying fixed correction factors.

Figure 8:
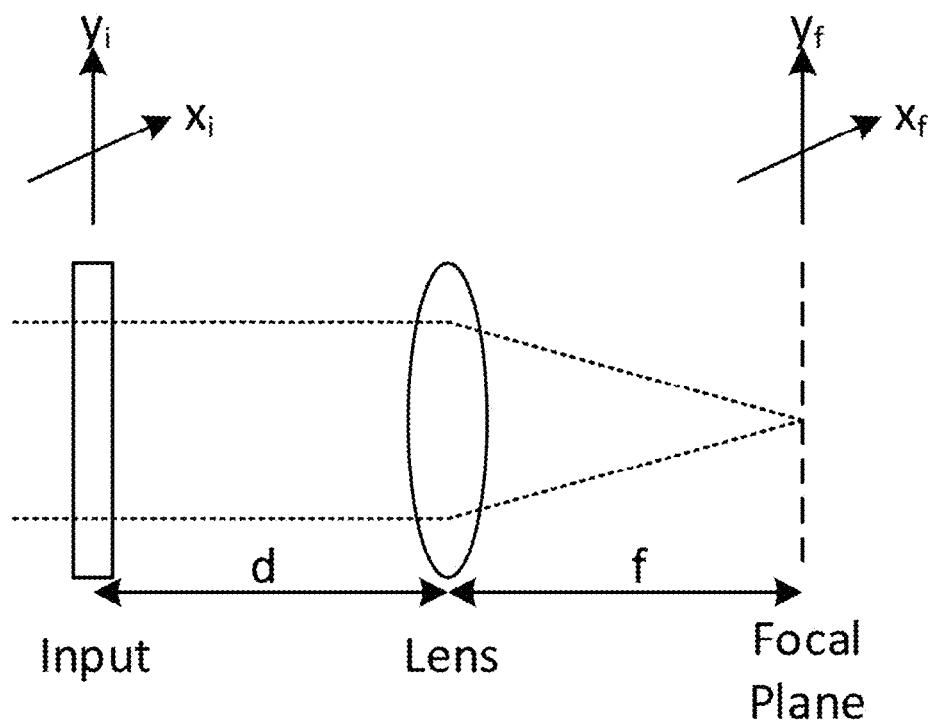
FIG. 8 is a schematic representation of a lens arrangement, in accordance with an embodiment.

It can be shown that given the described arrangement in FIG. 8, where a plane wave with amplitude A is incident on an input transparency with amplitude transmittance $t_A(x_i,y_i)$ placed a distance d away from a lens, the field $U_f(x_f, y_f)$ on the back focal plane of the lens, which is located a focal length f away from the lens, can be described by:

$$U_f(x_f,y_f) = \frac{A\exp\left[\frac{jk}{2f}\left(1-\frac{d}{f}\right)(x_f^2+y_f^2)\right]}{j\lambda f} \quad \text{(Eq. 13)}$$

$$\int\int_{-\infty}^{\infty} t_A(x_i,y_i)\exp\left[-\frac{j2\pi}{\lambda f}(x_i x_f+y_i y_f)\right]dx_i dy_i$$

Referring to FIG. 8 a schematic representation of a lens arrangement, in accordance with an embodiment. It can be seen that if $d=f$, then the field $U_f(x_f,y_f)$ on the back focal plane of the lens is simply the Fourier transform of the input $t_A(x_i,y_i)$, where the spatial frequencies $k_x$ and $k_y$ in (1) are as follows [Goodman 106], where $f$ is the focal length of the lens:

$$k_x = 2\pi f_x = \frac{2\pi x_f}{\lambda f} \quad \text{(Eq. 14)}$$

$$k_y = 2\pi f_y = \frac{2\pi y_f}{\lambda f}$$

This relation can be summed up in the following equation, illustrating that the field at the focal plane is a scaled Fourier transform of the input.

$$U_f(x_f,y_f) = \frac{A}{j\lambda f}\mathcal{F}[t_A(x_i,y_i)] \quad \text{(Eq. 15)}$$

The received field on the focal plane can then be multiplied by a factor $jf\lambda/A$ to cancel out the constant scale factor, leaving only the Fourier transform. This relation is valid when the Fresnel and paraxial approximations apply. While this result is shown for optical fields, the same wave phenomena apply to acoustic fields as well.

Figure 9:
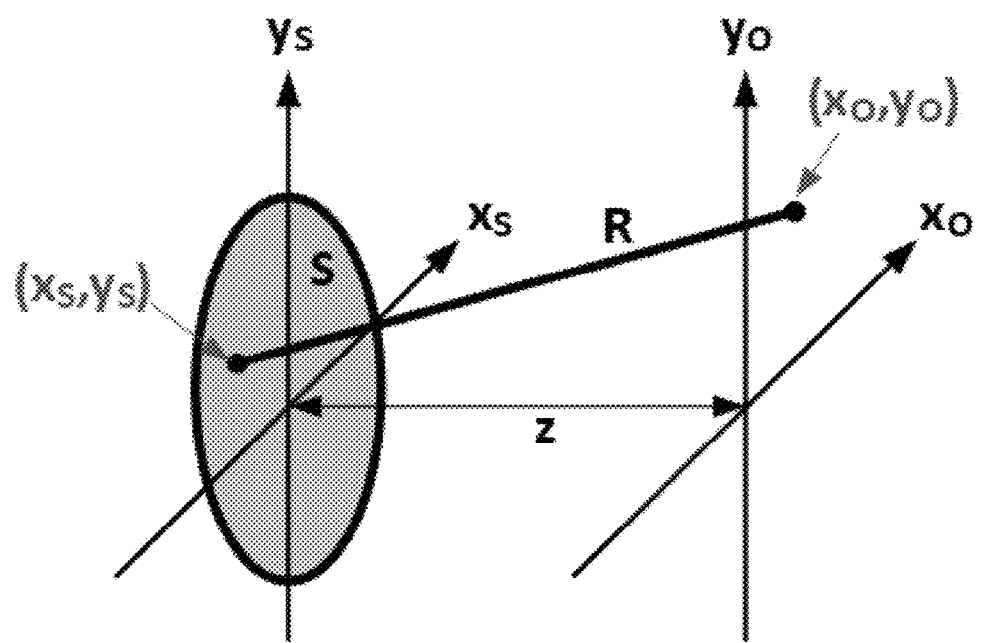
FIG. 9 is a schematic representation of a lens arrangement, in accordance with an embodiment.

For the lensless case, the propagation distance must be extended into the Fraunhofer zone. It can be shown that for a monochromatic source S located on a source plane $(x_s, y_s)$, as shown in FIG. 9, illustrating propagation from a source S on a source plane $(x_s, y_s)$ to an observation plane $(x_o, y_o)$ for Equation (16). It can be defined by an aperture function $\Omega(x_s,y_s)$, that is 0 outside of S and 1 inside of S, and an apodization function $\xi(x_s,y_s)$ that describes the spatial amplitude and phase variation of S, the pressure phasor $\tilde{p}(x_o, y_o, Z; \omega)$ on the observation plane $(x_o, y_o)$ can be written as Equation (16), where $v_0$ is a constant amplitude term that describes the source particle velocity amplitude in the case of no amplitude apodization:

$$\tilde{p}(x_0,y_0,z;\omega) \approx \frac{j\omega\rho v_0}{2\pi R}e^{-jk\left(z+\frac{x_0^2+y_0^2}{2z}\right)} \quad \text{(Eq. 16)}$$

$$\int_{-\infty}^{\infty}\int_{-\infty}^{\infty}\Omega(x_s,y_s)\xi(x_s,y_s)e^{j(k_x x_s+k_y y_s)}dx_s dy_s$$

The integral in Equation (16) is simply the Fourier transform of $\Omega(x_s,y_s)\xi(x_s,y_s)$ using spatial frequencies $k_x=-kx_o/z$ and $k_y=-ky_o/z$. Thus, Equation (16) can therefore be written as:

$$\tilde{p}(x_0,y_0,z;\omega) \approx \frac{j\omega\rho v_0}{2\pi R}e^{-jk\left(z+\frac{x_0^2+y_0^2}{2z}\right)}\mathcal{F}[\Omega(x_s,y_s)\xi(x_s,y_s)] \quad \text{(Eq. 17)}$$

This expression shows that the far field pressure field is simply the Fourier transform of the product of the apodization and aperture functions multiplied by a constant term and a phase term.

From the above expression, it can be seen that the Fourier transform is scaled by an amplitude term C and a phase term $\Phi$:

$$C = \frac{\omega\rho_0 v_0}{2\pi R} \quad \text{(Eq. 18)}$$

$$\Phi = je^{-jk\left[z+\frac{x_0^2+y_0^2}{2z}\right]}$$

To retrieve the Fourier transform from the pressure wave, these terms must be canceled out by multiplying by a constant scale factor 1/C and applying a coordinate dependent phase correction to each receive transducer pixel on the observation plane to cancel out $\Phi$. Note that there will be an additional amplitude factor from the pressure to voltage conversion in the piezoelectric transducers that will need to be canceled out as well.

Figure 10:
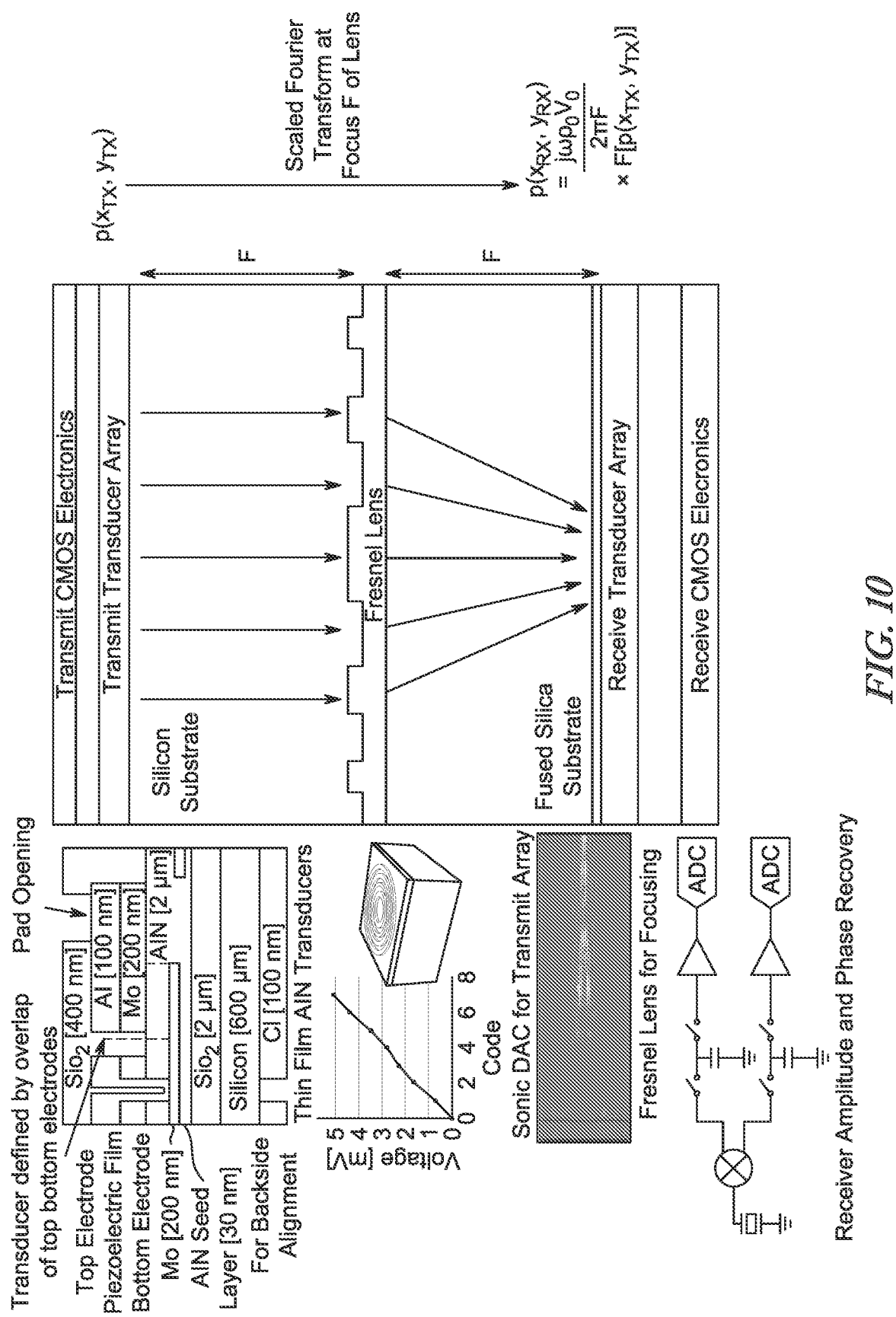
FIG. 10 is a schematic representation of a system that uses an acoustic lens for Fourier transform calculation, in accordance with an embodiment.
Figure 11:
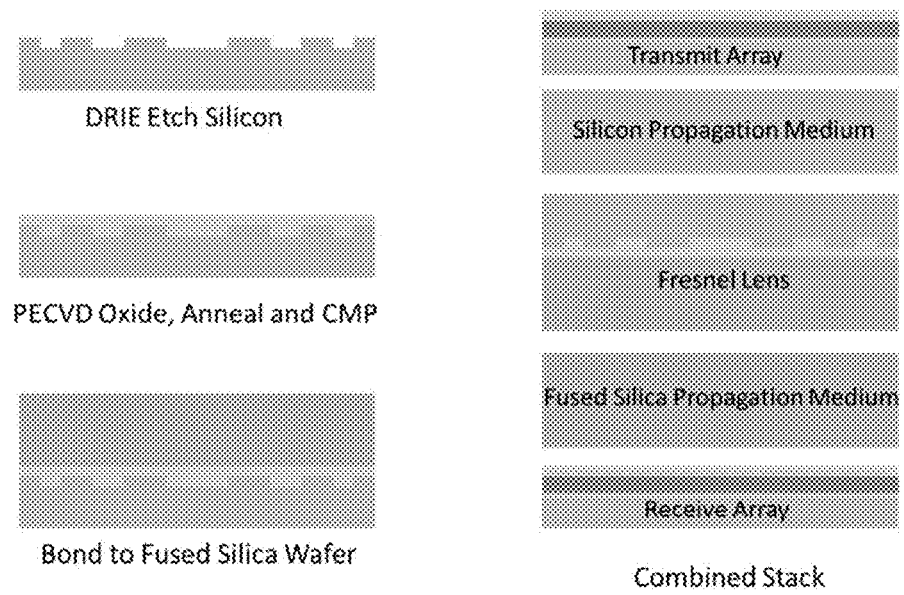
FIG. 11 is a schematic representation of a fabrication process to make the lens structure, in accordance with an embodiment.

The lensless approach is more complex and results in more errors due to the coordinate dependent phase term. Therefore, a system that uses an acoustic lens for Fourier transform calculation is proposed in FIG. 10. Referring to FIG. 11 is a schematic representation of a fabrication process to make the lens structure.

Accuracy and SNR of FFT in Frequency Domain with Focusing

In optics, it is possible to apply a distribution U(x,y) at the front focal plane of a lens and obtain the Fourier Transform at the back focal plane of the lens.

In the previous section, the Fraunhofer approximation was applied, ignoring the $x_1^2+y_1^2$ term in the expansion below.

$$R = \sqrt{z^2+(x_0-x_1)^2+(y_0-y_1)^2} = \quad \text{(Eq. 19)}$$

$$z\left[1+\left(\frac{x_0-x_1}{z}\right)^2+\left(\frac{y_0-y_1}{z}\right)^2\right]^{\frac{1}{2}} =$$

$$z\left\{1+\frac{1}{2z^2}[(x_0^2+y_0^2)^2-2(x_0 x_1+y_0 y_1)+(x_1^2+y_1^2)]+...\right\}$$

If one does not ignore that term, one will instead have the Fresnel approximation, where the additional phase term appears in the integral.

$$\underline{p}(x_0, y_0, z; \omega) \approx \frac{j\omega\rho_0 v_0}{2\pi R} e^{-jk\left[z + \frac{x_0^2 + y_0^2}{2z}\right]} \quad \text{(Eq. 20)}$$

$$\int_{-\infty}^{+\infty}\int_{-\infty}^{+\infty} \Omega(x_1, y_1)\xi_0(x_1, y_1) e^{-\frac{jk}{2z}(x_1^2+y_1^2)} e^{-j(k_x x_1 + k_y y_1)} dx_1 dy_1$$

Now there are two phase terms that must be cancelled in order to achieve the Fourier Transform—one preceding the integral, and one within the integral. To see how to cancel out the $$e^{-\frac{jk}{2z}(x_1^2+y_1^2)}$$

phase term within the integral, one must first place a lens immediately next to the input plane at z=0. The phase contribution from the lens is:

$$T_L(x_1, y_1) = e^{\frac{jk(x_1^2+y_1^2)}{2F}} \quad \text{(Eq. 21)}$$

Therefore, at the observation plane, our pressure phasor is now:

(Eq. 22)

$$\underline{p}(x_0, y_0, z; \omega) \approx$$

$$\frac{j\omega\rho_0 v_0}{2\pi R} e^{-jk\left[z + \frac{x_0^2+y_0^2}{2z}\right]} \int_{-\infty}^{+\infty}\int_{-\infty}^{+\infty} \Omega(x_1, y_1)\xi_0(x_1, y_1)$$

$$T_L(x_1, y_1) e^{-\frac{jk}{2z}(x_1^2+y_1^2)} e^{-j(k_x x_1+k_y y_1)} dx_1 dy_1 =$$

$$\frac{j\omega\rho_0 v_0}{2\pi R} e^{-jk\left[z+\frac{x_0^2+y_0^2}{2z}\right]} \int_{-\infty}^{+\infty}\int_{-\infty}^{+\infty} \Omega(x_1, y_1)\xi_0(x_1, y_1)$$

$$e^{\frac{jk(x_1^2+y_1^2)}{2F}} e^{-\frac{jk}{2z}(x_1^2+y_1^2)} e^{-j(k_x x_1+k_y y_1)} dx_1 dy_1$$

It is seen that if the observation plane is situated at z=F, then the terms $$e^{\frac{jk(x_1^2+y_1^2)}{2F}} e^{-\frac{jk}{2z}(x_1^2+y_1^2)}$$

within the integral will cancel out and the integral becomes:

$$\underline{p}(x_0, y_0, z = F; \omega) \approx \frac{j\omega\rho_0 v_0}{2\pi R} e^{-jk\left[F+\frac{x_0^2+y_0^2}{2F}\right]} \quad \text{(Eq. 23)}$$

$$\int_{-\infty}^{+\infty}\int_{-\infty}^{+\infty} \Omega(x_1, y_1)\xi_0(x_1, y_1) e^{-j(k_x x_1+k_y y_1)} dx_1 dy_1$$

So how does one cancel out the $$e^{-jk\left[F+\frac{x_0^2+y_0^2}{2F}\right]}$$

term preceding the integral? Neglecting evanescent waves, one notes that, if one has a pressure wave p(x, y; z;t) propagating in the z direction, with sinusoidal drive at frequency ω, then its pressure phasor $\underline{p}(x, y; z;\omega)$ is related by:

$$p(x,y;z;t) = \underline{p}(x,y;z;\omega)e^{j\omega t} \quad \text{(Eq. 24)}$$

One can write it as:

$$\underline{p}(x, y; z; \omega) = \frac{1}{4\pi^2} \iint_{-\infty}^{+\infty} S(k_x, k_y; z) e^{j(k_x x + k_y y)} dk_x dk_y \quad \text{(Eq. 25)}$$

Where $S(k_x, k_y; z)$ is the angular spectrum of $\underline{p}(x, y; z;\omega)$—essentially it is writing it as the aggregate of its plane wave components. If the wave is propagating from a source plane at z'=0 to an observation plane at z'=z, then through use of the Helmholtz theorem, it can be shown that:

$$\underline{p}(x, y; z; \omega) = \frac{1}{4\pi^2} \iint_{-\infty}^{+\infty} S(k_x, k_y; 0) e^{j(k_x x + k_y y + k_z z)} dk_x dk_y \quad \text{(Eq. 26)}$$

where $S(k_x, k_y; 0)$ is the spectrum of the pressure wave at the source plane z'=0.

Looking at the previous two equations, it is seen that the spectrums at the source and observation planes are related as follows:

$$S(k_x, k_y; z) = S(k_x, k_y; 0)e^{jk_z z} = S(k_x, k_y; 0)e^{jz\sqrt{k^2-(k_x^2+k_y^2)}} \quad \text{(Eq. 27)}$$

This relation can be described as the wave propagation transfer function. Applying a Taylor approximation (essentially applying Fresnel approximation to this term as well), one can rewrite this phase term as:

$$e^{jz\sqrt{k^2-(k_x^2+k_y^2)}} = e^{jzk\sqrt{1-\frac{k_x^2+k_y^2}{k^2}}} \approx e^{jzk\left[1-\frac{1}{2}\left(\frac{k_x^2+k_y^2}{k^2}\right)\right]} \quad \text{(Eq. 28)}$$

Figure 12:
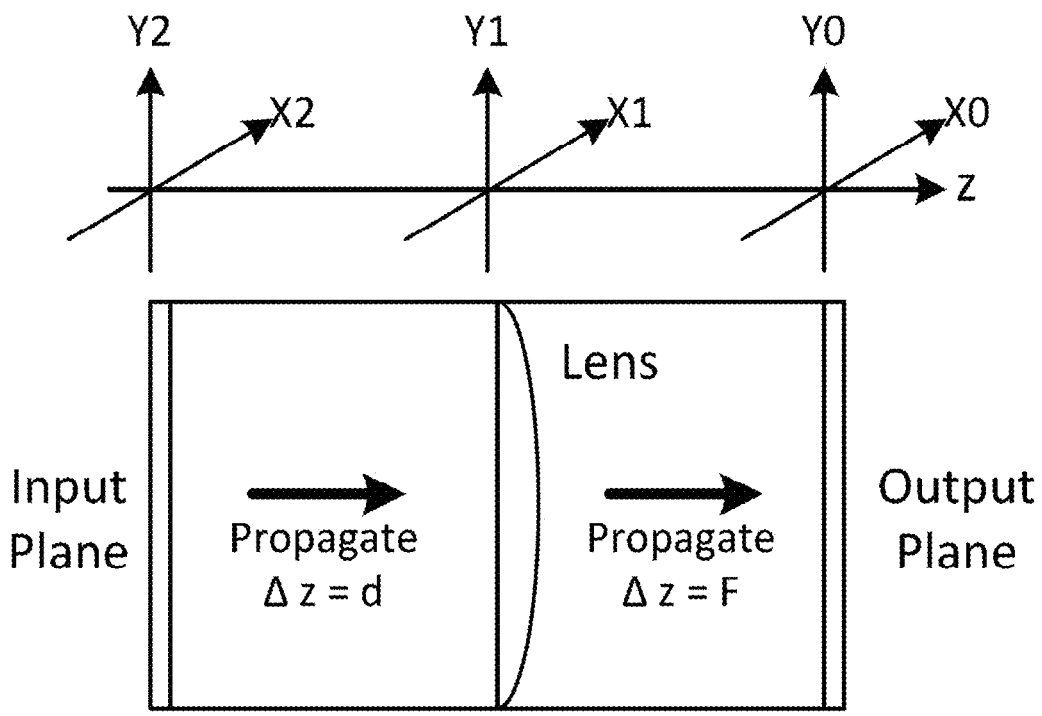
FIG. 12 is a schematic representation of an input/output flow, in accordance with an embodiment.

Therefore, it is noted that if one propagates an initial distribution at z=0 a distance z=d before entering the lens, as shown in the figure below, one is able to cancel out the phase factor outside the integral using the steps shown in FIG. 12.

Assuming the input plane is the $x_2, y_2$ plane, the plane where the lens is situated is the $x_1, y_1$ plane, and the observation plane is the $x_0, y_0$ plane. One can express the Fourier transform of the pressure wave at the input plane as $\mathcal{F}_2(k_x, k_y) = \mathcal{F}(p(x_2, y_2))$, where $p(x_2, y_2)$ is the pressure at the input plane. Similarly, one can express the Fourier transform of the pressure at the lens plane as $\mathcal{F}_1(k_x, k_y)$.

From the previous discussion of the wave propagation transfer function, one notes that:

$$S(k_x, k_y; z) = S(k_x, k_y; 0)e^{jk_z z} \quad \text{(Eq. 29)}$$

$$= S(k_x, k_y; 0)e^{jz\sqrt{k^2-(k_x^2+k_y^2)}}$$

$$\approx S(k_x, k_y; 0)e^{jzk\left[1-\frac{1}{2}\left(\frac{k_x^2+k_y^2}{k^2}\right)\right]}$$

One can use this to relate $\mathcal{F}_1$ and $\mathcal{F}_2$:

$$\mathcal{F}_1(k_x, k_y) = \mathcal{F}_2(k_x, k_y)e^{jkd}e^{-\frac{jd}{2k}(k_x^2+k_y^2)} \qquad \text{(Eq. 30)}$$

From our discussion of the phase cancellation properties of a lens at the focal point, one can write the pressure distribution on the observation plane as $p(x_0, y_0)$:

$$p(x_0, y_0) = \frac{j\omega\rho_0 v_0}{2\pi F} e^{-jk\left[F+\frac{x_0^2+y_0^2}{2F}\right]} \mathcal{F}_1(k_x, k_y) \qquad \text{(Eq. 31)}$$

Where one have assumed that $R \approx z = F$, where F is the focal distance of the lens. One can write this in terms of the Fourier transform of the input plane as:

$$p(x_0, y_0) = \frac{j\omega\rho_0 v_0}{2\pi F} e^{-jk\left[F+\frac{x_0^2+y_0^2}{2F}\right]} e^{jkd} e^{-\frac{jd}{2k}(k_x^2+k_y^2)} \mathcal{F}_2(k_x, k_y) \qquad \text{(Eq. 32)}$$

Noting that $k_x = -kx_0/z$ and $k_y = -ky_0/z$:

$$p(x_0, y_0) = \frac{j\omega\rho_0 v_0}{2\pi F} e^{-jk\left[F+\frac{x_0^2+y_0^2}{2F}\right]} e^{jkd} e^{-\frac{jd}{2k}(x_0^2+y_0^2)} \mathcal{F}_2(k_x, k_y) \qquad \text{(Eq. 33)}$$

It is sees that if $d=F$, then the phase terms cancel out, leaving:

$$p(x_0, y_0) = \frac{j\omega\rho_0 v_0}{2\pi F} \mathcal{F}_2(k_x, k_y) \qquad \text{(Eq. 34)}$$

which simplifies the Fourier transform multiplied by a constant phase and amplitude scale factor term.

Once advantage of using a lens is that it gives us the Fourier transform directly, therefore one does not need to scale the array elements with a phase term. Furthermore, operating using the Fresnel approximation allows closer distances than if using the Fraunhofer approximation.

Figure 13:
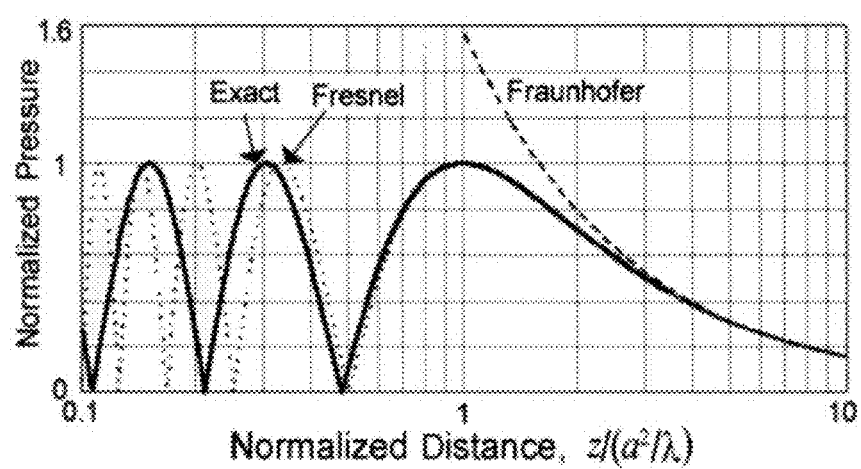
FIG. 13 is a graph of Fresnel approximation, in accordance with an embodiment.

Notably, there are constraints on a system implemented with an ideal lens. As an initial constraint, the Fresnel approximation must hold and Z1=Z2=F. In FIG. 13, from the prior art and as shown earlier, it is seen that the Fresnel approximation holds well into the near field. The other big limitation on the propagation distances is that the transmit and receive planes must be located one focal length away from the lens.

Regarding the size of the receive array, from the previous discussion on Shannon-Nyquist sampling and on ensuring that most of the spectral power must be captured, there are the previous constraints:

$$\Delta x_1 < \frac{\lambda z}{2x_{0,max}} \qquad \text{(Eq. 35)}$$

$$\Delta y_1 < \frac{\lambda z}{2y_{0,max}}$$

$$\frac{z\lambda}{2R_{TXDCR}} > D_R > \frac{10z\lambda}{2R_{TARR}}$$

Models typically use a far field approximation, so the focal length of the lens should be in the Fraunhofer zone. One can state that the pressure in the far field is:

$$p(r, \theta; t) = \frac{ja\rho_0 c_0 u_0}{r} \frac{J_1(ka\sin\theta)}{\sin\theta} e^{j(\omega t - kt)} = \frac{jaP_0}{r} \frac{J_1(ka\sin\theta)}{\sin\theta} e^{j(\omega t - kr)} \qquad \text{(Eq. 36)}$$

where a is the radius of the piston, $\rho_0$ is the density of the medium, $c_0$ is the speed of sound in the medium, $u_0$ is the piston velocity, and $2P_0$ is the maximum axial pressure.

To apply a focus operation to the field to simulate the effects of the lens at the observation plane focal point, one must multiply the field by the following phase factor:

$$\Phi_{Lens} = \exp\left[+j\frac{k}{2z_f}(x^2+y^2)\right] \qquad \text{(Eq. 37)}$$

where $z_f$ is the focal length of the lens.

While in actuality, the system is dealing with square transducers and square arrays, one must first consider that the entire transmit aperture is circular and transmitting from the entire area (the array consists of infinitesimally small transducers), to start comparing beam patterns with expected Fourier Transforms and explore the effects of discretizing the array into finite sized transducer elements.

Assuming a transmit array that is 100 μm in radius and that the ultrasound waves are propagating in a medium with speed of sound 8000 m/s and at 1 GHz, giving a wavelength of 8 μm. In order for this array to be in the Fraunhofer zone, the focal length must be:

$$z_f > \frac{2.3a^2}{\lambda} = 2.9 \text{ mm} \qquad \text{(Eq. 38)}$$

To reduce error from the approximation, the transducer is placed a little further than this, at 4 mm, and assumes that there is a perfect lens that can focus at that value. Before plotting the equation, it is noted that there is a singularity point in the far field piston diffraction pattern when $\sin(\theta) \to 0$, that is when x=0 and y=0. Noting that $$\lim_{x\to 0} \frac{J_1(x)}{x} = \frac{1}{2},$$

one can find the value at x=0 and y=0 as follows:

$$p(r, \theta; t) = \frac{jaP_0}{r} \frac{J_1(ka\sin\theta)}{\sin\theta} e^{j(\omega t - kr)} = \frac{jaP_0}{r} \frac{ka}{ka} \frac{J_1(ka\sin\theta)}{\sin\theta} e^{j(\omega t - kr)} \qquad \text{(Eq. 39)}$$

$$\lim_{ka\sin\theta\to 0} p(r, \theta; t) = \frac{1}{2} \frac{jka^2 P_0}{r} e^{j(\omega t - kr)}$$

It was previously noted that after the pressure at the focal point of a lens is a scaled/constant phase shifted Fourier transform (assuming $r \approx z_F = F$):

$$p(x_0, y_0) = \frac{j\omega p_0 v_0}{2\pi F} \mathcal{F}_2(k_x, k_y) \quad \text{(Eq. 40)}$$

Rewriting this in terms of P0, by using the relation $k=\omega/c_0$:

$$p(x_0, y_0) = \frac{jkP_0}{2\pi F} \mathcal{F}_2(k_x, k_y) \quad \text{(Eq. 41)}$$

Therefore, it is necessary to divide by the factor $jkP_0/2\pi F$ to recover the Fourier Transform. The following 2 plots are generated for an aperture of radius 100 µm, velocity 8000 m/s, frequency 1 GHz, wavelength 8 µm, and zf=4 mm. The lens focusing has been applied by multiplying the piston field with the lens phase contribution and the pressure field has been scaled by $jkP_0/2\pi F$ to enable a direct comparison with the Fourier Transform. Note that to reduce computation time, the receive plane used for calculation does not fit 98% of the spectral power, as stated as a requirement previously.

The x-y coordinates can be transformed to the appropriate spatial frequencies fx and fy using the relations:

$$f_x = -\frac{kx}{2\pi z} \quad \text{(Eq. 42)}$$
$$f_y = -\frac{ky}{2\pi z}$$

Figure 14A:
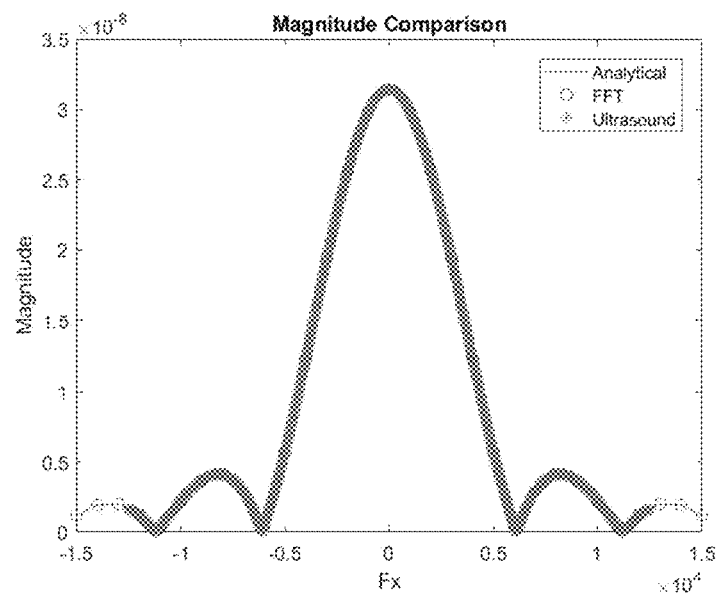
FIG. 14A is a magnitude comparison plot for y=0, in accordance with an embodiment.
Figure 14B:
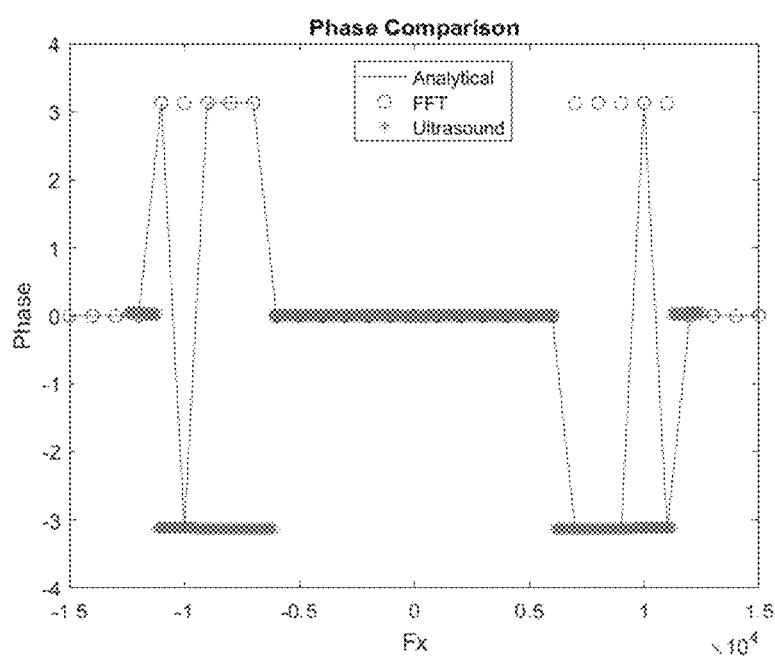
FIG. 14B is a phase comparison plat for y=0, in accordance with an embodiment.

For the most direct comparison, one can first compare this to the Fourier transform of a circle with radius $$100E\text{-}6: circ\left(\frac{r}{a}\right),$$

where a is 100E-6. The plots for y=0 are shown in FIGS. 14A and 14B. It is seen that they are approximately equal, remembering that $-\pi$ and $\pi$ phase are equal, To compare the error, it is noted that as small variations along the real and imaginary axes in complex space can lead to a 180 degrees phase shift, it is difficult to compare phase errors. Instead of comparing phase and amplitude, the below values are compared:

Error=Magnitude($F_{FT}$–$F_{US}$)

% Error=100%×Magnitude($F_{FT}$–$F_{US}$)/Magnitude ($F_{FT}$) (Eq. 43)

where $F_{FT}$ is the Fourier Transform computed analytically (or later on using FFT) and $F_{US}$ is the Fourier Transform computed using ultrasound. This is simply a comparison of the change in vector length in complex space. The locations with maximum error are at the nulls of the Fourier Transform. While the percent error may seem huge at these points—this is the result of dividing a small value by an even smaller value that is almost 0 and it is further noted that the actual error is very small at these points.

Normalizing the error by the maximum amplitude in the Fourier Transform, a value is obtained that is a better comparison than an % error plot. Therefore, it is seen that the error is quite acceptable for a Fourier Transform computed using the field from a piston transducer using a far field approximation.

If one wants to use the aperture to represent the function $$circ\left(\frac{r}{100}\right)$$

instead of $$circ\left(\frac{r}{100E\text{-}6}\right),$$

what is the appropriate scaling to use? It can be seen that the Fourier transform of the function $$circ\left(\frac{r}{ca}\right)$$

has amplitude $c^2$ times that of the Fourier transform of the function $$circ\left(\frac{r}{a}\right).$$

Furthermore, the frequency at which the first zero is located for $$\mathcal{F}\left\{circ\left(\frac{r}{ca}\right)\right\}$$

is 1/c times the frequency of the first zero of $$\mathcal{F}\left\{circ\left(\frac{r}{a}\right)\right\}.$$

Summarizing the above, it is seen that the amplitude must be scaled by $c^2$ and the frequency axes must be multiplied by 1/c to be able to use the transmit array aperture to represent the Fourier transform of a circle with a radius c times that of the aperture radius.

It is desirable to discretize the receive plane into discrete transducer elements. A transducer integrates the received pressure on its surface, converting this force into a voltage. To convert the pressure profile into transducer voltages, one must integrate the pressure on each transducer.

It is noted that the minimum spatial wavelength of interest is the diameter of the transmit array aperture $D_x$. Therefore, the minimum spatial frequency of interest is $\Delta f_x = 1/D_x$. From the relations $\Delta k_x = 2\pi \times \Delta f_x$ and $\Delta k_x = k\Delta x_{RX}/z$, it is seen that the minimum transducer pitch should be $\Delta x_{RX} = z\Delta k_x/k$. However, because of sampling on the receive plane as well, one should work with transducer pitches that are half of that or smaller:

$$\Delta x_{RX} \leq \frac{z\Delta k_x}{2k} = \frac{z\pi}{kD_x} \quad \text{(Eq. 44)}$$

Figure 15:
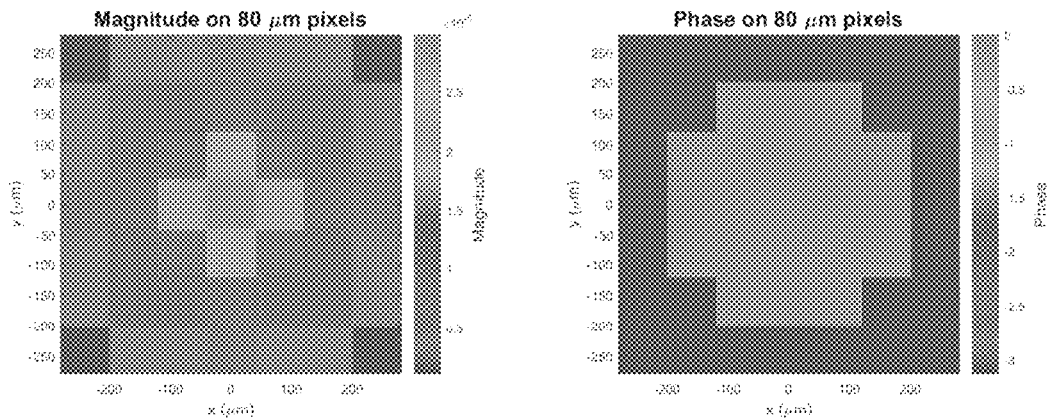
FIG. 15 is a graph of magnitude and phase on 80 μm transducers, in accordance with an embodiment.

Therefore, for the above transmit apertures, one needs $\Delta x_{RX} \leq 80$ µm. Shown in FIG. 15 is the magnitude (after scaling) on each transducer, assuming there is discretization of the observation plane into 80 µm transducers that are immediately adjacent to each other. The values for FIG. 15, for example are obtained by calculating the pressures on the receive plane in 0.25 µm intervals and then using the trapezoidal method to integrate over each transducer, and then normalizing by the area of each transducer.

Figure 16:
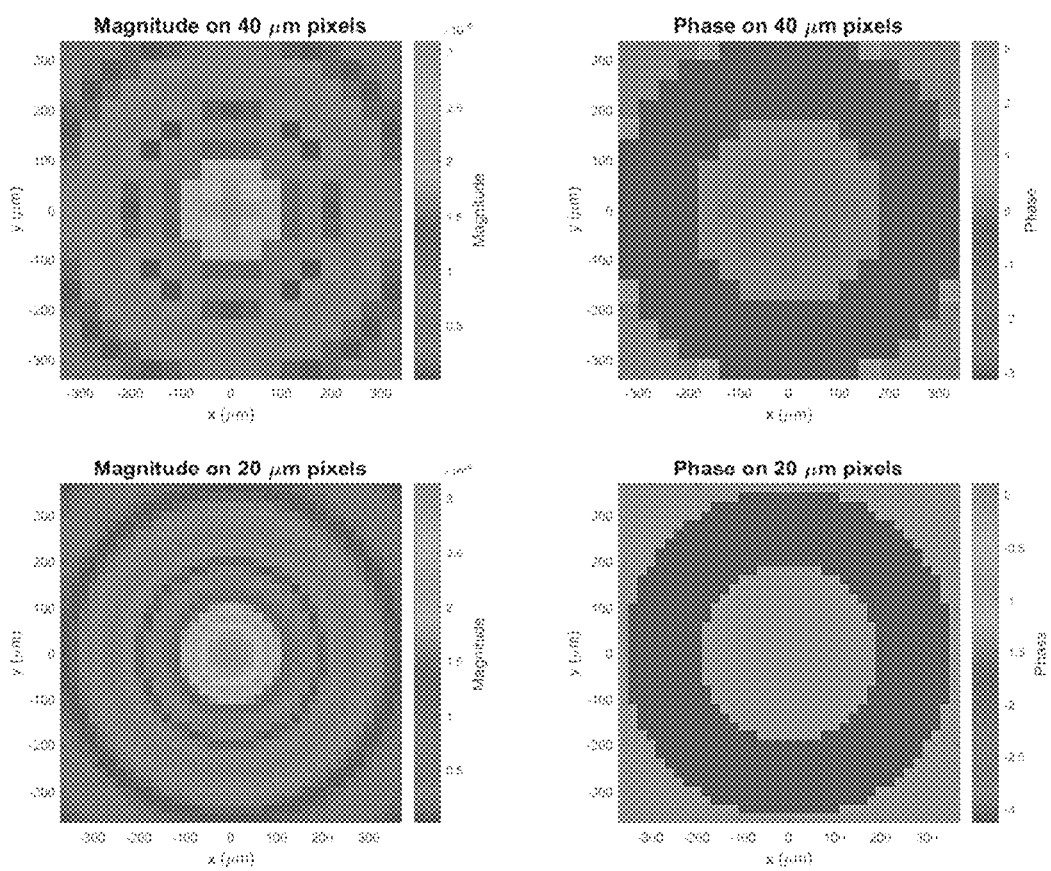
FIG. 16 is a graph of magnitude and phase on 40 μm or 20 μm transducers, in accordance with an embodiment.

It can be seen that in practice, one wants to oversample on the receive plane to get an image that more closely represents the Fourier transform. In FIG. 16 are the resolved images if 40 µm or 20 µm transducers are used.

Figure 17:
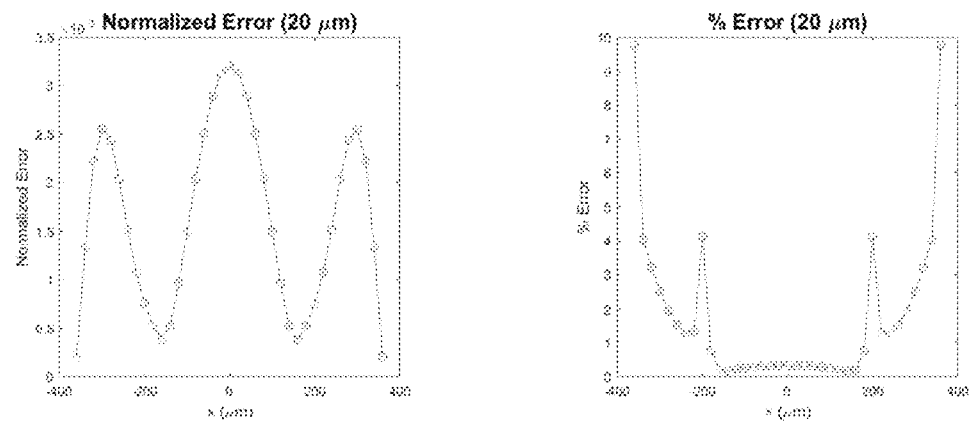
FIG. 17 depicts graphs of normalized error and percent error calculated for the deviation from expected pressure, in accordance with an embodiment.

One must also consider the error contributed by the integration over each transducer. The smaller the transducer is the closer it should represent the value of the pressure on its center, because there will be less contribution from off-center points. Before comparing directly against the Fourier Transform, it is desirable to first compare how well it captures the pressure profile. Shown in FIG. 17 are the normalized error and percent error calculated for the deviation from the expected pressure, as defined above.

Figure 18:
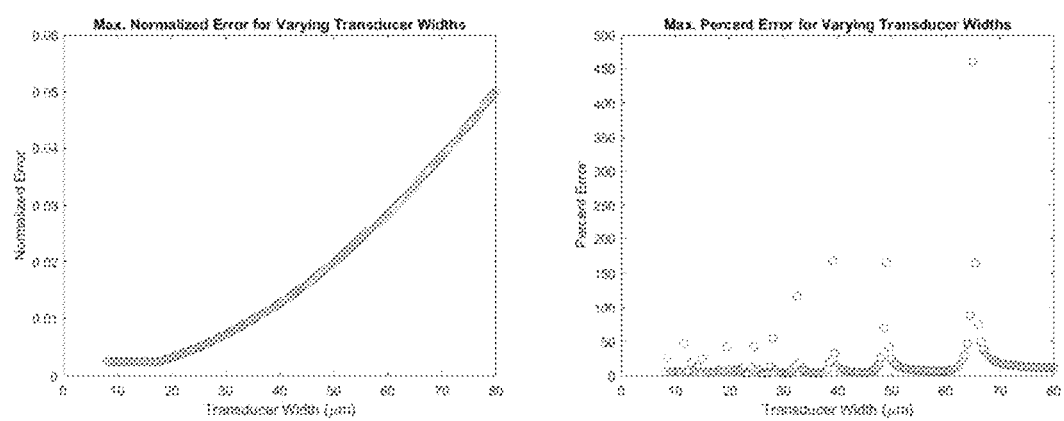
FIG. 18 depicts graphs of normalized maximum error when varying the transducer width from 1 wavelength (8 μm) to 80 μm in increments of 2 μm, in accordance with an embodiment.
Figure 19:
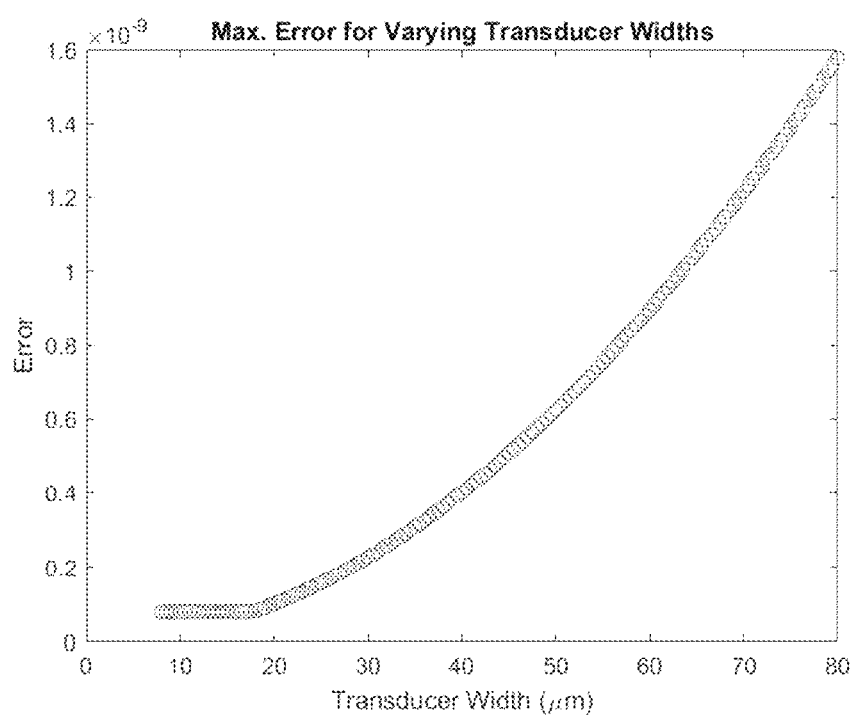
FIG. 19 is a graph of normalized maximum error when varying the transducer width from 1 wavelength (8 μm) to 80 μm in increments of 2 μm, in accordance with an embodiment.

Shown in FIGS. 18 and 19 are the results of varying the transducer width from 1 wavelength (8 µm) to 80 µm in increments of 2 µm and plotting the maximum error for each. One can see the effect of integration error on how well a transducer samples the pressure profile.

Figure 20:
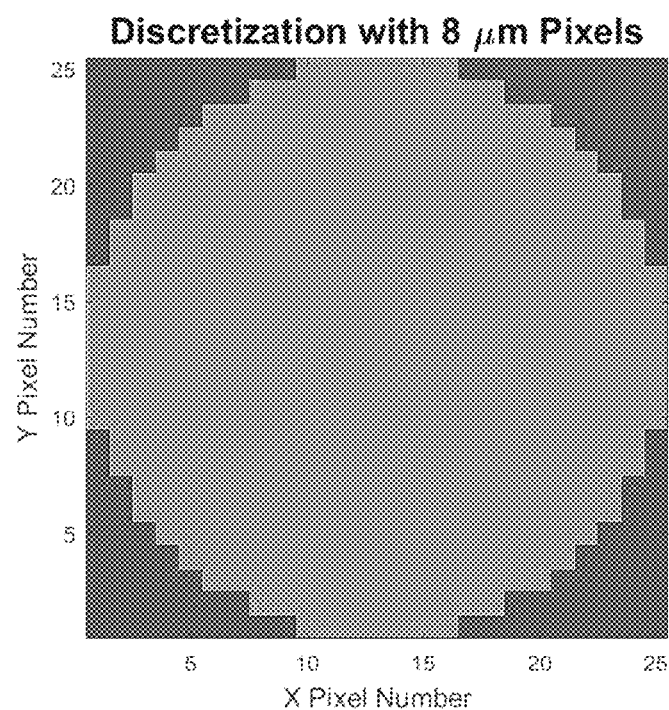
FIG. 20 is a graph using a wavelength large transducer, and discretizing the transmit plane, in accordance with an embodiment.
Figure 21:
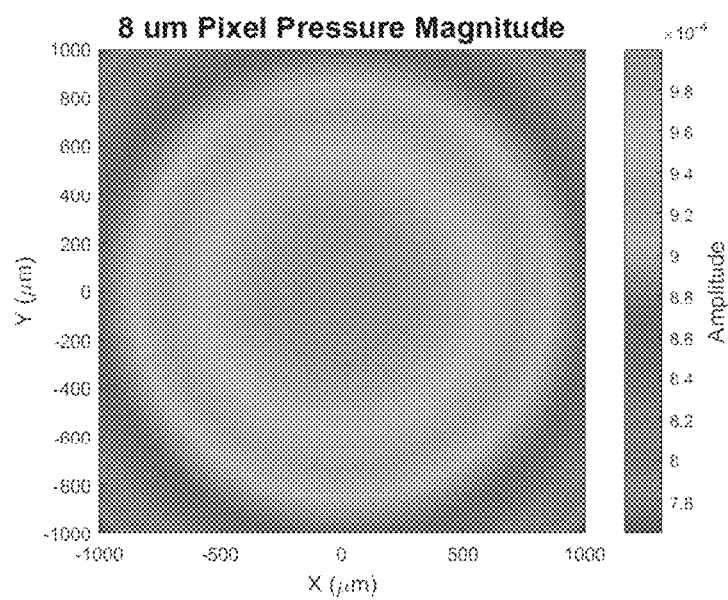
FIG. 21 is a graph of pixel pressure magnitude, in accordance with an embodiment.
Figure 22:
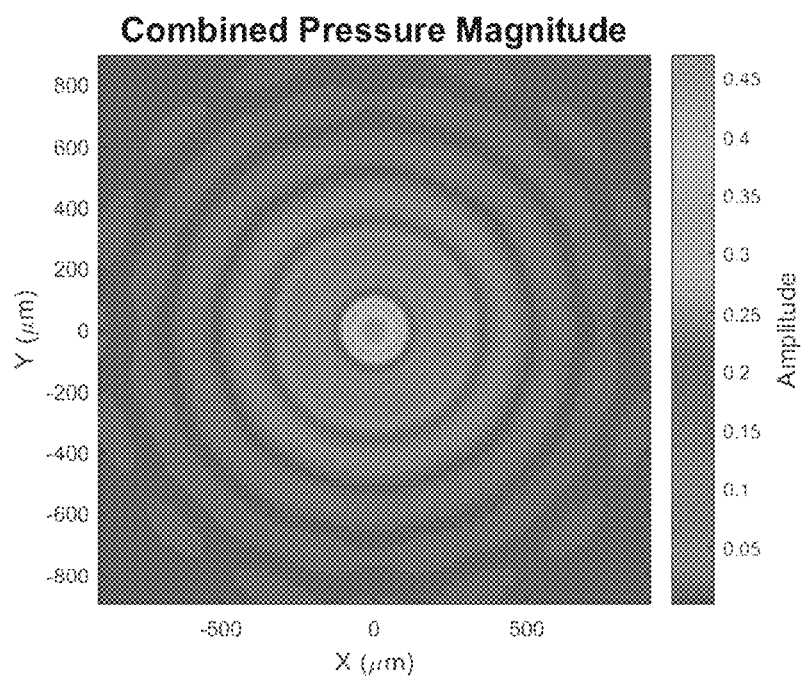
FIG. 22 is a graph of combined pressure magnitude, before focusing, in accordance with an embodiment.
Figure 23:
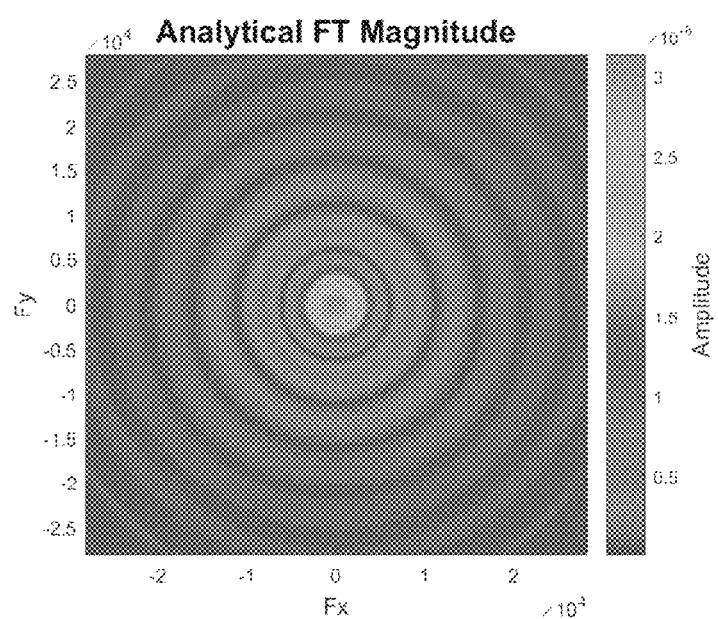
FIG. 23 is a graph of analytical FT magnitude, after focusing, in accordance with an embodiment.
Figure 24:
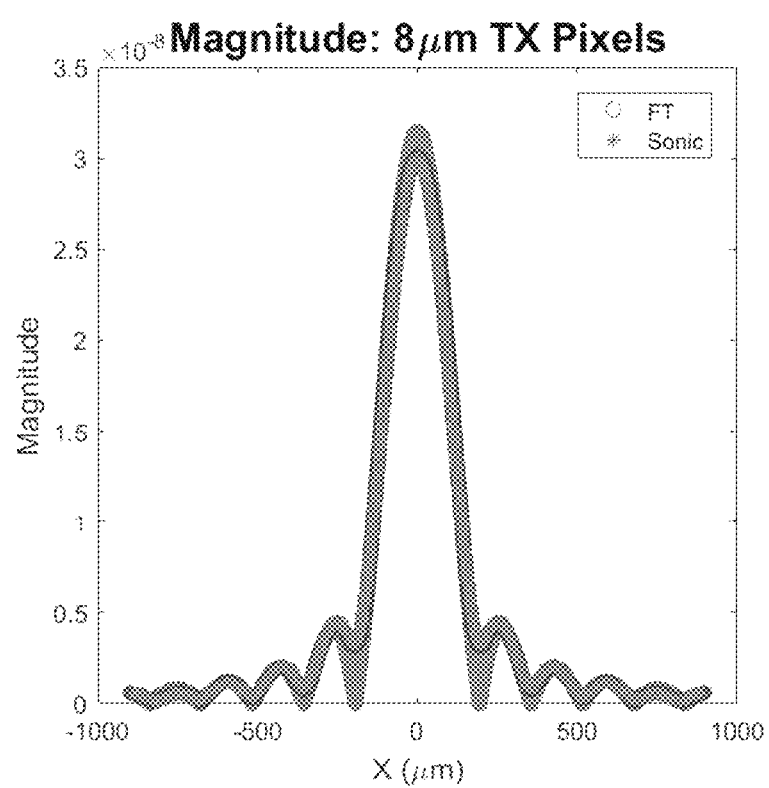
FIG. 24 is a graph of analytical FT magnitude, after focusing, in accordance with embodiment.

Referring to FIG. 20 is a graph using a wavelength large transducers, and discretizing the transmit plane, where FIG. 21 is a graph of pixel pressure magnitude, and FIG. 22 is a graph of combined pressure magnitude, before focusing. Referring to FIGS. 23 and 24 are graphs of analytical FT magnitude, after focusing.

A key requirement of SFFT is to be able to control phase and amplitude of the triggered pulse. Described herein (such as with regard to FIG. 10) is an ultrasonic DAC concept in which digital bits are used to trigger an array of N nanoscale piezoelectric transducers where the areas of each transducer is binary weighted according to its position in the binary number. A digital register holds the data to trigger each of the bits, and a second register is used to control the delay of each pixel to be fired to effectively control the phase. The power consumption of this implementation is determined by the capacitance of the registers used, and the capacitance of the piezoelectric nano-transducers. The efficiency of this implementation is ideal as no DC power is needed, as is typically the case of analog circuits. Furthermore, the direct digital to ultrasound allows for fast digital approaches of data transfer, such as on-chip optical transceivers to load a 2D array of digital registers.

In order to increase the sonic signal at the receiver, a Fresnel lens can focus the ultrasonic wavefronts onto the receiver. Since according to an embodiment the wavelength is 9 µm, a Fresnel lens can be fabricated by a silicon dioxide/silicon composite layer to form the binary spatial distribution of index-of-refraction. Simulations of the FFT with lens have verified the increase in the intensity of the received image while enabling the SFFT to be measured within an aperture that is equal to the depth over which the wavefront propagates.

Apodization Function Amplitude

To execute the amplitude of the apodization function, $\xi(x_s, y_s)$, in Eqn. (16), different transducer pixels in the transmitting plane $(x_s, y_s)$ should be assigned different actuating voltage amplitudes corresponding to the input spatial function. One way to implement that is to use a Digital to Analog Converter (DAC) circuit for each transmitting pixel. That allows the amplitude information to be stored digitally in a RAM and then loaded to the pixels to compute the FFT. One issue with DAC circuit is that conventional DAC's area scales exponentially with number of bits. Consequently, if high resolution is needed, having a DAC circuit for each pixel will be infeasible given the high density of the transmitting pixels array.

Figure 25:
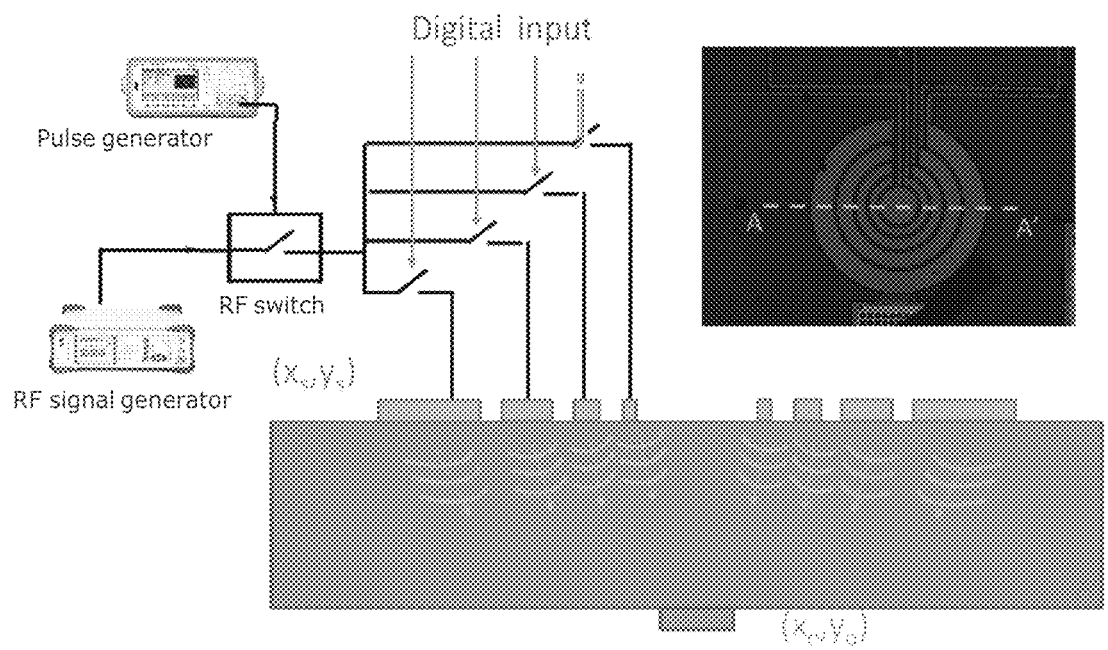
FIG. 25 is a schematic representation of a 4-bit version of a proposed Sonic Digital to Analog Converter, in accordance with an embodiment.

A 4-bit version of the proposed Sonic DAC is shown in FIG. 25, each pixel in the transmitter array is divided into concentric rings which are binary weighted in area. The equation for the far field pressure magnitude along the axis perpendicular to the transmitting plane and passing through the center of the ring can be written as:

$$|p(a_o, a_i)| = \omega \rho_o v_o \frac{a_o^2 - a_i^2}{2z} \quad \text{(Eq. 45)}$$

Equation 45 shows that the received pressure along the propagation axis is linearly proportion to the area of the ring $(a_o^2 - a_i^2)$, As a result, the sensed pressure from the binary weighted transmitting rings is also binary weighted. As shown in FIG. 25, a digital input is used to determine which of the binary weighted transducer ring is actuated and the resulting pressures add up in the observation plane $(x_o, y_o)$. The assumptions that all the pressure waves will add up is only valid if the size of the whole pixel (all the concentric rings) is in the order of the wavelength of the acoustic waves ~9 µm.

Figure 26:
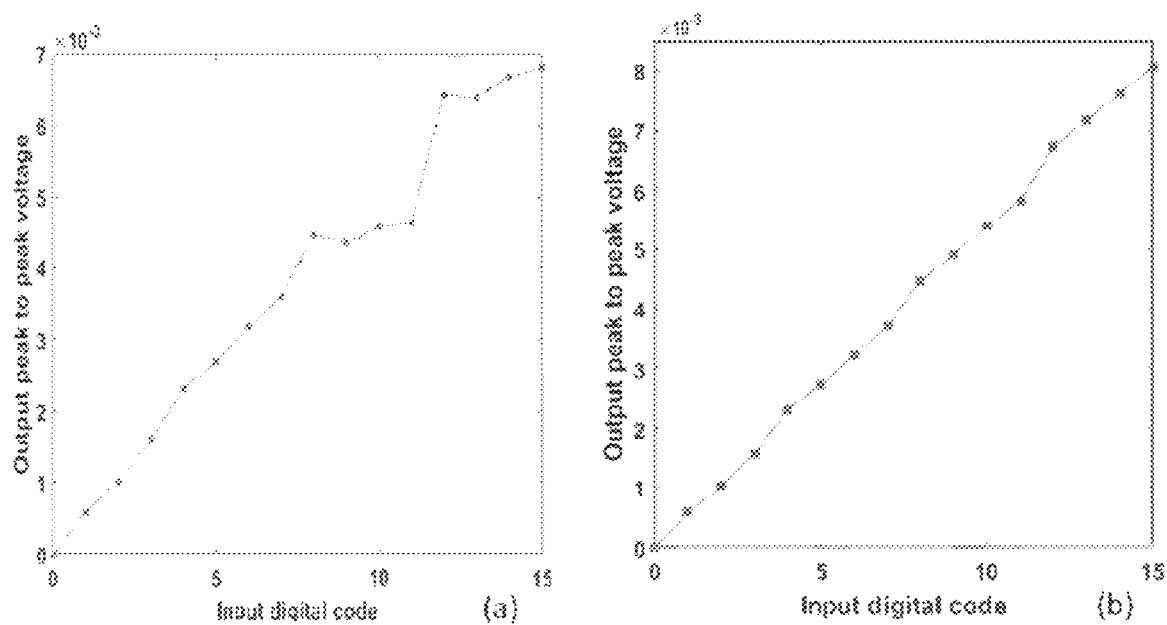
FIG. 26 is a graph of measured input/output curve for the 4-bit Digital to Analog Converter, in accordance with an embodiment.

FIG. 26 shows the measured input/output curve for the 4-bit DAC. Panel (a) depicts an output curve showing non-monotonicity and uneven steps due to the phase mismatch, and panel (b) depicts an input/output curve after adjusting the received signals from transducers to be in phase. Due to lithography limitation, the tested pixel size is 200 µm which is ~20 times the wavelength of the pressure wave, and as a result, the received waves have different phases and they don't add up instructively which is clearly shown in FIG. 26, panel (a). However, after post processing the output and getting rid of the phase term acceptable linearity between the input code and the output voltage can be achieved (FIG. 26, panel (b)). This proves that if the phase difference between rings is negligible (the case where the pixel size is less than or equal the wavelength), output voltage will vary linearly with input binary code.

Figure 27:
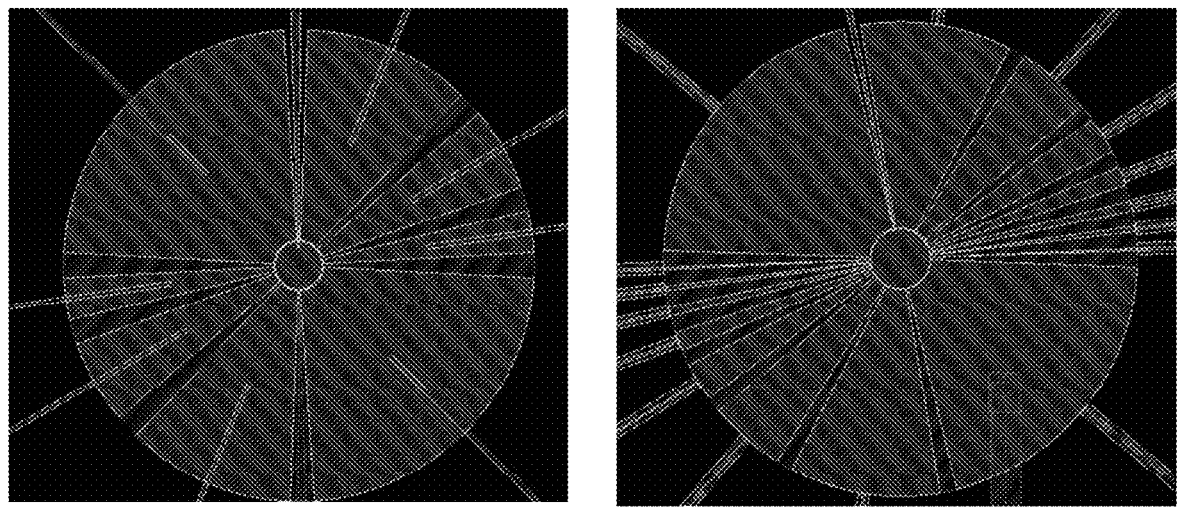
FIG. 27 is a schematic representation of dividing a transducer pixel by cutting it in binary weighted slices instead of rings, in accordance with an embodiment.

Another way of dividing the transducer pixel is cutting it in binary weighted slices instead of rings as shown in FIG. 27. The advantage of this structure compared to the concentric ring is that all transducers are equidistant from the center axis, so regardless of the size of the pixel, all the pressure waves from different slices will add up in the observation plane.

Apodization Function Phase

Figure 28:
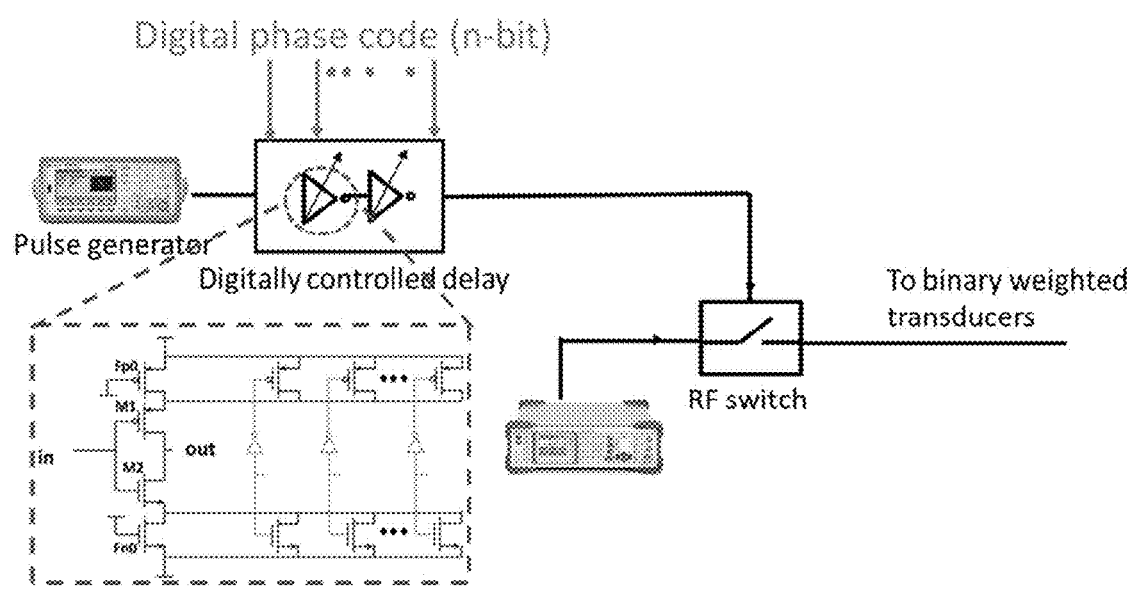
FIG. 28 is a schematic representation showing an implementation of an input phase using a digitally controlled delay element, in accordance with an embodiment.

To implement the phase term in the apodization function in Equation 16, the RF switch control signal is delayed by a digitally controlled delay (FIG. 28), Hence, the input to each pixel is delayed by an amount corresponding to the phase term in the apodization function. The digitally controlled delay is implemented using a 2-level stacked inverter where the current charging/discharging the output capacitance of the inverter is directly proportional to the input digital code. Even number of inverters are used to preserve the logic.

Digital DAC with Both Amplitude and Phase Control

Figure 29:
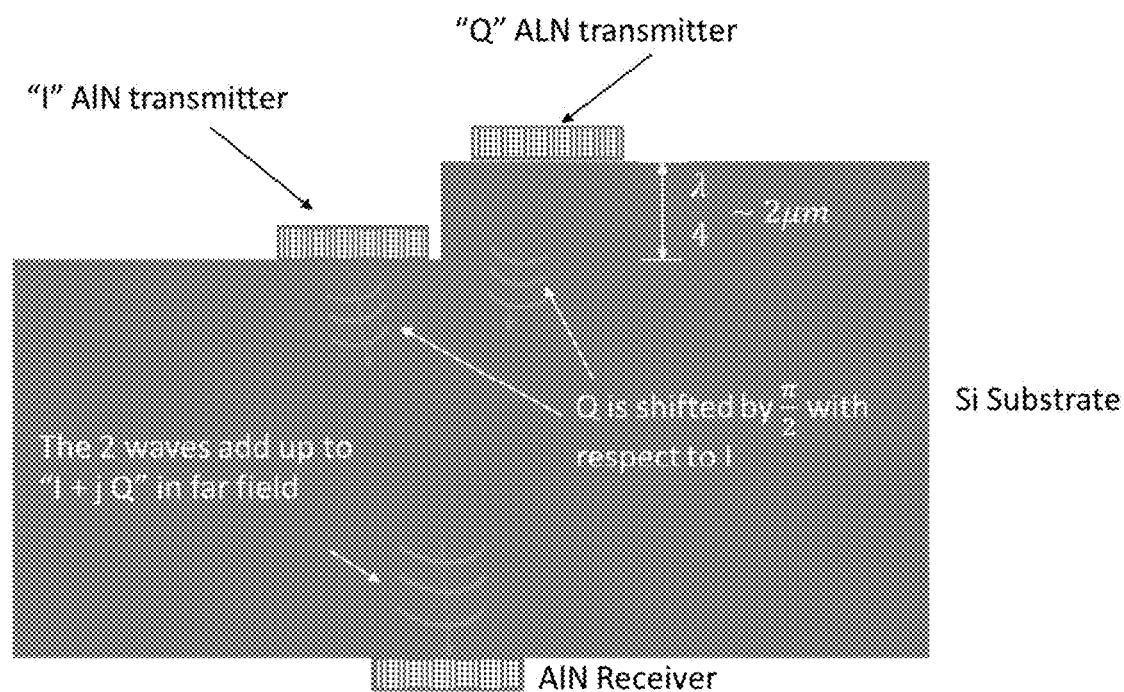
FIG. 29 is a schematic of a structure in which the inverters driving the I and Q transducers are spaced in height by a fraction of wavelength so as to add the amplitudes with a phase shift, in accordance with an embodiment.

Referring to FIG. 29 is a schematic of a structure in which the inverters driving the I and Q transducers are spaced in height by a fraction of wavelength so as to add the amplitudes with a phase shill. The transmit side needs both amplitude and phase of each pixel is to be controlled using phase shifters, that if electronic can consume power and introduce RF coupling. Hence a method to digital control the phase without needing complex circuitry would be useful. The drive side CMOS digital electronics consisting of memory elements including SRAM would be triggered into scaled inverters into the array of AlN DACs, spaced z by the right spatial phase to generate a phase shift in the output of the. Similarly, one can place the receiver transducers spaced in z to achieve additional phase shifts in a set of receiver electrodes as shown in the figure below. In addition to phase, one needs to control the delay at which the pixels will actuate—these delays can be incorporated into digital counters that generate a delay pulse depended on a digital value, Hence for each pixel, a digital SRAM will consist of the I and Q values, and a delay values that will allow phase, amplitude and delay to be controlled.

Figure 30:
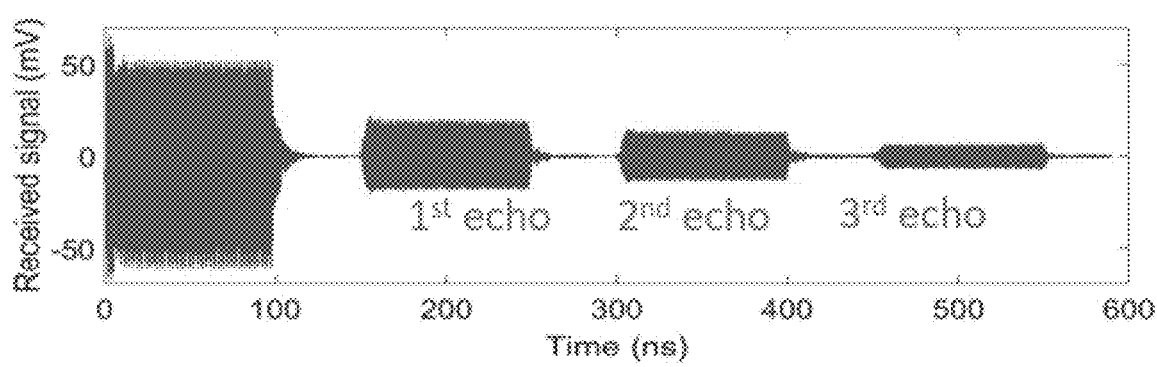
FIG. 30 is a graph showing output signal showing multiple reflections of acoustic waves, in accordance with an embodiment.

As acoustic waves travel in the silicon substrate, it experiences multiple reflections due to the high acoustic impedance mismatch between silicon and air. That results in multiple echoes received by the receiving transducer as shown in FIG. 30. In some applications, multiple reflections need to be eliminated. For example, when using a ultrasonic transducer array to calculate 2D Fourier transform using acoustic wave diffraction property in the far field, after exciting the transmitting array with a 2D function, one will need to wait until the signal fades out before exciting the transmitting array by the next function. This limits the calculation speed.

Figure 31:
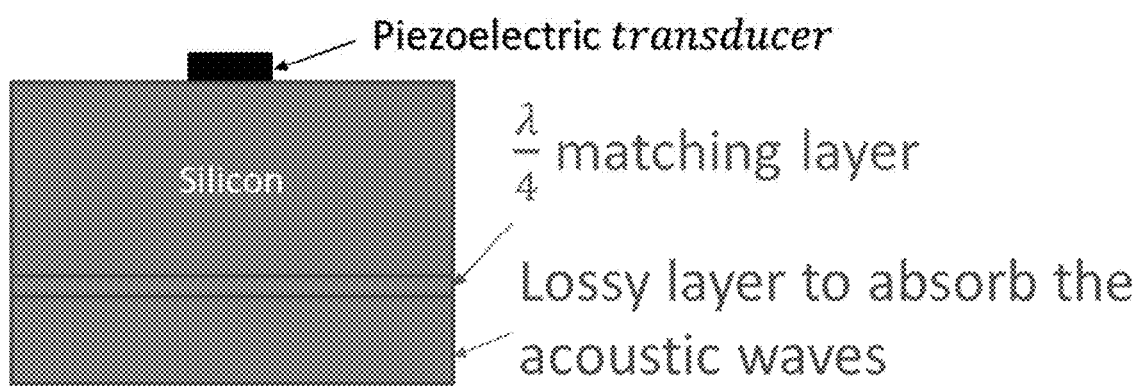
FIG. 31 is a schematic representation showing a λ/4 matching layer deposited on the back side of silicon followed by a thick lossy absorbing layer, in accordance with an embodiment.
Figure 32:
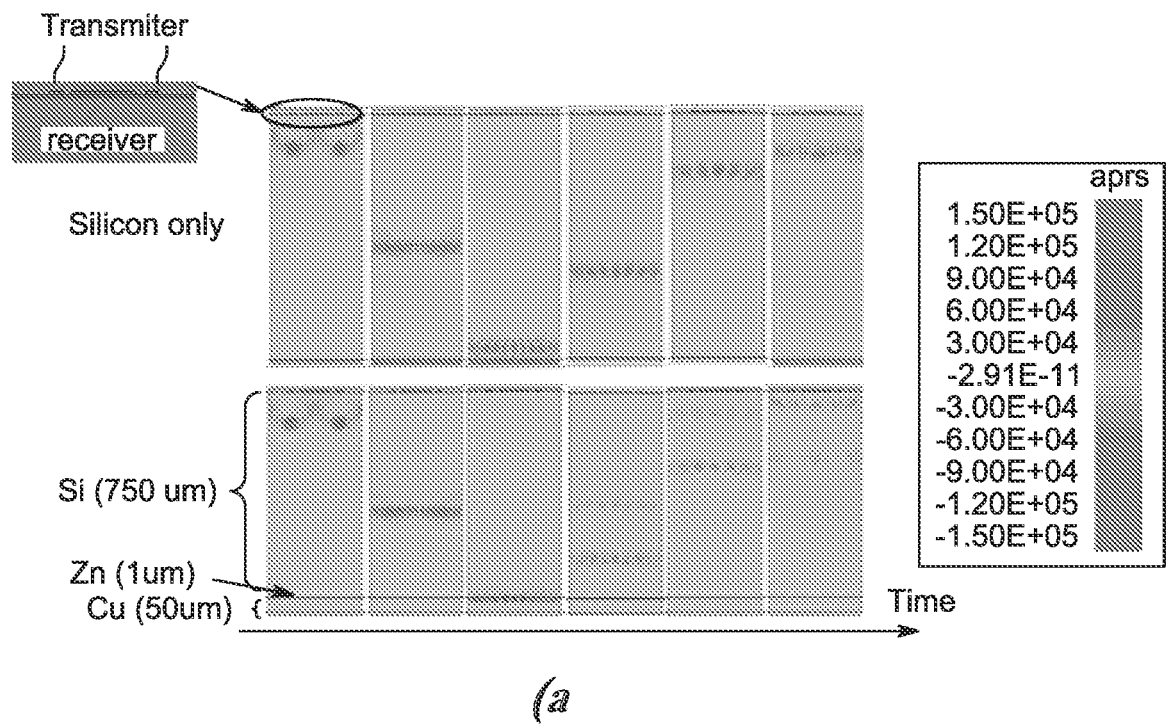
FIG. 32 shows: (a) acoustic waves propagating in silicon substrate for no absorbing layer and Zn/Cu absorbing layer, and (b) output voltage at the receiver transducer for different copper thicknesses, in accordance with an embodiment.
Figure 32:
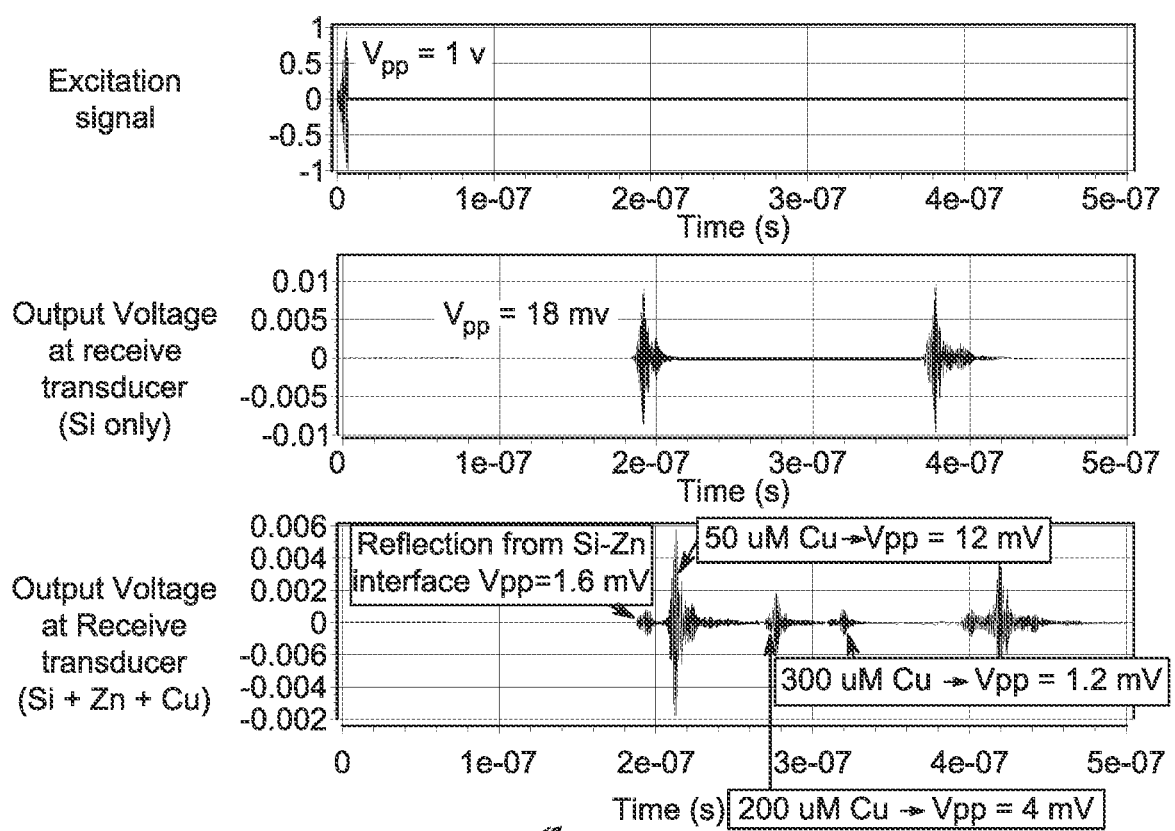

To eliminate multiple reflections a λ/4 matching layer need to be deposited on the back side of silicon followed by a thick lossy absorbing layer as shown in FIG. 31. Copper is used as the absorbing layer because it has a high acoustic loss (27000 dB/m) and Zinc is used as the matching layer because its acoustic impedance satisfies the λ/4 matching criteria $Z_{zn} = \sqrt{Z_{si} Z_{cu}}$.

Figure 33:
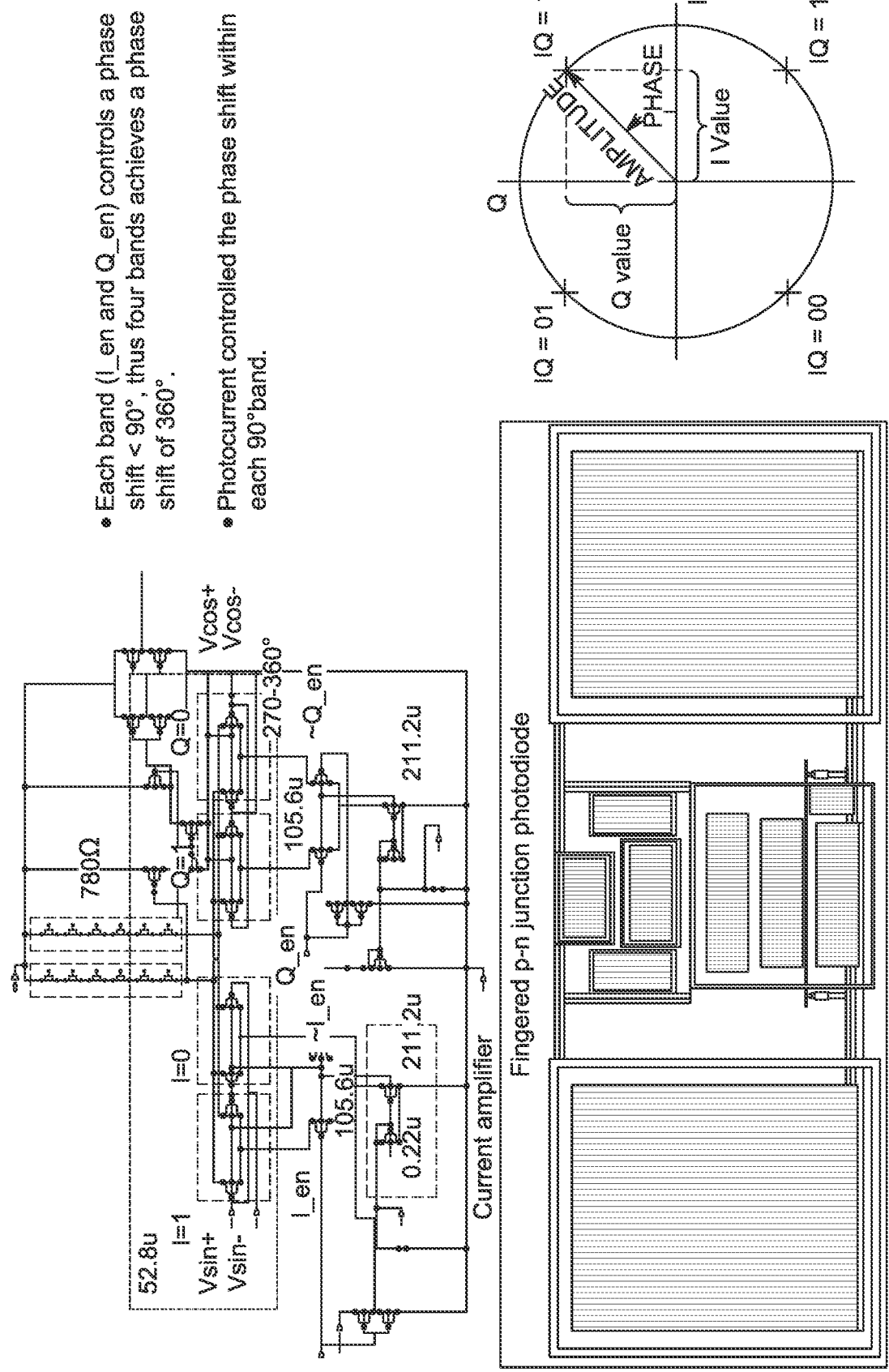
FIG. 33 is a schematic representation of an optically-driven 2D array, in accordance with an embodiment.

Pzflex simulations in FIG. 33 show an attenuation in the reflected signal when comparing wave propagation in silicon only and silicon with Zn/Cu absorbing layer. The output voltage from the receiving transducer show an attenuation in the first reflected signal of 33%, 77%, and 93% for a copper thicknesses of 50 μm, 200 μm, and 300 μm, respectively.

In some cases the input to the 2D array needs to be driven optically. In this case, photodiode arrays, very much like the pixels in a camera array can be used to receive amplitude and phase of an image, which can then modulate the RF drive of the AlN pixels. Such a circuit is shown below. The two photodiodes receive optical energy and will drive the AlN pixel with the right phase and amplitude using the analog CMOS circuit. Alternatively, one can use just one pixel to control the amplitude of the AlN transducer in the case an image is acquired and its Fourier transform is required. See, for example, FIG. 34.

Figure 34:
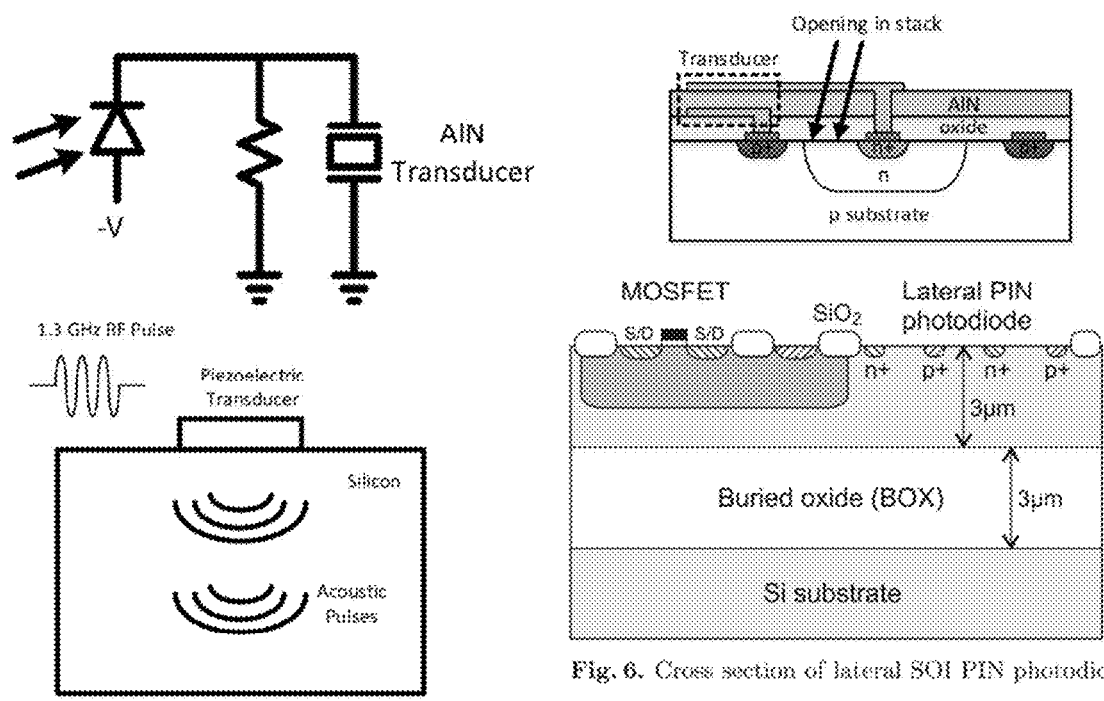
FIG. 34 is a schematic representation of AlN pixels with RF in the optics, in accordance with an embodiment.

In another embodiment, such as that shown in FIG. 34, the light is modulated at GHz, and hit on a PD that directly drives a AlN pixel, perhaps through some analog amplification stage.

Figure 35:
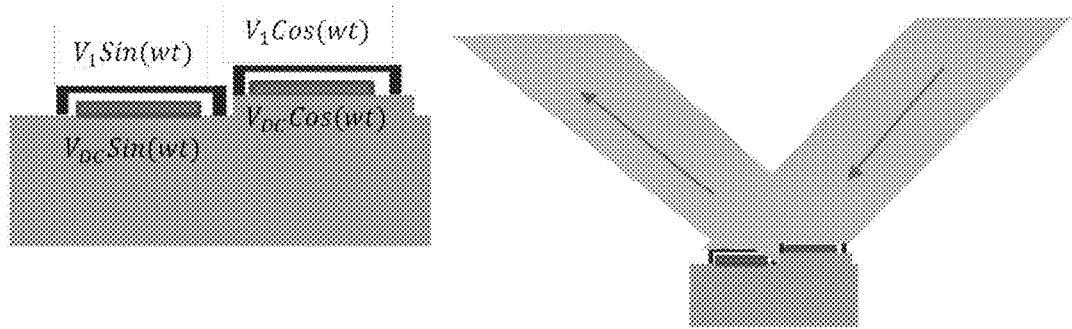
FIG. 35 a schematic representation of an optical phase shift on a reflected signal, in accordance with an embodiment.

On the receive side, if done in RF CMOS, multitude of RF receivers are needed with the ability to mix and acquire I and Q values. Another method is to bend a mirror in proportion to the input RF voltage on the receive electrodes. This can be done using electrostatically driven mirror pixels. For example, the voltage generated on a I and Q receiver can be applied to an electrostatic mirror. The force across an electrostatic actuator is $$f \sim \frac{\epsilon_0 A}{g^2}(V_1 - V_2)^2 \qquad \text{(Eq. 46)}$$

where $V_1$ and $V_2$ are the voltages across the gap between the movable mirror and the rigid electrode with the voltage. Hence the force produces displacement proportional to $V_1^2 - 2V_1 V_2 + V_2^2$. In order to get large displacements, $V_1$ can be a dc bias voltage to increase displacement. The $V_2$ can be the sense voltage with either Sin or Cosine phase shift. Two pixels with Sin and Cos voltages would lead to an effective optical phase shift on the reflected signal that is proportional to the phase difference between the two pixels, providing optical output proportional to the phase of the input ultrasonic amplitude. See, for example, FIG. 35.

While embodiments of the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. A device configured for low-energy ultrasonic 2D Fourier transform analysis, comprising:
   a bulk ultrasonic transmission medium;
   a first array of piezoelectric pixels, comprising a first plurality of pixels, disposed on a first side of the bulk ultrasonic transmission medium to define a first transmitting plane at the first side of the bulk ultrasonic transmission medium; and
   a second array of piezoelectric pixels, comprising a second plurality of pixels, disposed on a second side of the bulk ultrasonic transmission medium to define a first receiving plane at the second side of the bulk ultrasonic transmission medium;
   wherein the first array of piezoelectric pixels is configured to output an ultrasonic wave at the first transmitting plane responsive to an input signal comprising an input phase and an input magnitude, and
   wherein the first receiving plane defined by the second array of piezoelectric pixels corresponds to a Fourier plane for the ultrasonic wave output by the first array of piezoelectric pixels.

2. The device of claim 1, wherein the bulk ultrasonic transmission medium comprises silicon, sapphire, silicon-carbide, or a combination thereof.

3. The device of claim 1, wherein the first array of piezoelectric pixels, the second array of piezoelectric pixels, or the first and the second array of piezoelectric pixels comprises PZT, aluminum nitride, zinc oxide, or combinations thereof.

4. The device of claim 1, wherein the first array of piezoelectric pixels is configured to generate an ultrasonic wave approximating a 2D Fourier transform of the input signal to the first array of piezoelectric pixels.

5. The device of claim 1, wherein the first array of piezoelectric pixels, the second array of piezoelectric pixels, or the first and the second array of piezoelectric pixels comprises GHz transducers.

6. The device of claim 5, wherein the GHz transducers are configured to operate at a frequency of between approximately 0.5 to 5 GHz.

7. The device of claim 1, further comprising one or more signal interconnects electrically connected to and located externally to the first array of piezoelectric pixels and to the second array of piezoelectric pixels.

8. The device of claim 1, further comprising a complementary metal-oxide-semiconductor (CMOS) stack positioned between the first array of piezoelectric pixels and the bulk ultrasonic transmission medium.

9. The device of claim 8, further comprising one or more interconnects integrated by the CMOS stack.

10. The device of claim 1, wherein the first array of piezoelectric pixels is configured to emit ultrasonic waves into the bulk ultrasonic transmission medium having characteristics corresponding to a Fourier transform of the input signal.

11. The device of claim 1, further comprising a Fresnel lens disposed between the first array of piezoelectric pixels and the second array of piezoelectric pixels, the Fresnel lens being disposed and configured to focus the ultrasonic wave output by the first array of piezoelectric pixels at the first transmitting plane onto the second array of piezoelectric pixels.

12. The device of claim 11, wherein the Fresnel lens is disposed a focal length away from the first transmitting plane of the first array of piezoelectric pixels and is disposed a focal length away from the first receiving plane of the second array of piezoelectric pixels.

13. The device of claim 12,
wherein the bulk ultrasonic transmission medium comprises a first bulk ultrasonic transmission medium and a second bulk ultrasonic transmission medium,
wherein the first array of piezoelectric pixels is disposed adjacent the first bulk ultrasonic transmission medium,
wherein the second array of piezoelectric pixels is disposed adjacent the second bulk ultrasonic transmission medium, and
wherein the Fresnel lens is disposed between the first bulk ultrasonic transmission medium and the second bulk ultrasonic transmission medium.

14. The device of claim 1, wherein the first array of piezoelectric pixels and the second array of piezoelectric pixels each comprise an array of concentric rings.

15. The device of claim 1, wherein the first array of piezoelectric pixels and the second array of piezoelectric pixels each comprise a plurality of binary weighted slices.

16. The device of claim 1, wherein the piezoelectric pixels in the first array of piezoelectric pixels or the second array of piezoelectric pixels have a width between 1 wavelength to 10 wavelengths.

17. The device of claim 16, wherein at least some of the piezoelectric pixels in the first array of piezoelectric pixels, the second array of piezoelectric pixels, or the first and the second array of piezoelectric pixels are spaced in height, relative to other piezoelectric pixels in the respective array, by a fraction of a wavelength.

18. The device of claim 1, wherein a lateral dimension of the first transmitting plane of the first array of piezoelectric pixels is a product of the number of pixels disposed along the lateral dimension and a wavelength of the input signal.

19. The device of claim 1, further comprising a lens disposed between the first transmitting plane of the first array of piezoelectric pixels and the first receiving plane of the second array of piezoelectric pixels.

20. A device configured for low-energy ultrasonic 2D Fourier transform analysis, comprising:
a bulk ultrasonic transmission medium;
a first array of piezoelectric pixels, comprising a first plurality of pixels, disposed on a first side of the bulk ultrasonic transmission medium;
a second array of piezoelectric pixels, comprising a second plurality of pixels, disposed on the first side of the bulk ultrasonic transmission medium; and
a reflector disposed at a second side of the bulk ultrasonic transmission medium opposite the first side,
wherein the first array of piezoelectric pixels is configured to output an ultrasonic wave toward the reflector responsive to an input signal comprising an input phase and an input magnitude, and
wherein the second array of piezoelectric pixels corresponds to a Fourier plane for the ultrasonic wave output by the first array of piezoelectric pixels.

* * * * *